US006474236B1

(12) United States Patent
Naniwa et al.

(10) Patent No.: US 6,474,236 B1
(45) Date of Patent: Nov. 5, 2002

(54) PLATE MATERIAL PLACEMENT APPARATUS AND METHOD

(75) Inventors: Mutsumi Naniwa, Shizuoka (JP); Hidefumi Sera, Shizuoka (JP); Takao Nakayama, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/624,774

(22) Filed: Jul. 25, 2000

Related U.S. Application Data

(62) Division of application No. 09/289,945, filed on Apr. 13, 1999, now Pat. No. 6,112,664.

(30) Foreign Application Priority Data

| Apr. 13, 1998 | (JP) | 10-101330 |
| May 7, 1998 | (JP) | 10-124865 |
| Sep. 28, 1998 | (JP) | 10-273745 |

(51) Int. Cl.[7] ............................................. B41F 27/06
(52) U.S. Cl. .................................. 101/477; 101/415.1
(58) Field of Search .......................... 101/477, 415.1, 101/375, 376, 378

(56) References Cited

U.S. PATENT DOCUMENTS

| 3,677,121 A | 7/1972 | Etchell ........................ 83/437 |
| 3,735,627 A | 5/1973 | Eburn, Jr. ..................... 72/324 |
| 3,779,761 A | * 12/1973 | Dustin ....................... 101/401.3 |
| 5,127,328 A | * 7/1992 | Wieland .................... 101/415.1 |
| 5,661,566 A | 8/1997 | Gerber ........................ 358/304 |
| 5,749,298 A | * 5/1998 | Castelli et al. ............ 101/415.1 |
| 5,771,090 A | 6/1998 | Verlinden et al. ............. 355/27 |
| 6,116,160 A | * 9/2000 | Burnett et al. ............ 101/415.1 |

FOREIGN PATENT DOCUMENTS

JP          9-156077 A   *  6/1997

* cited by examiner

Primary Examiner—Daniel J. Colilla
(74) Attorney, Agent, or Firm—Sughrue Mion, PLLC

(57) ABSTRACT

A plate making apparatus of a flexible plate material 13, 22 being placed on a plate cylinder 7 for executing planographic printing in multiple colors. The plate making apparatus has a cutter 23 being placed between a storage section 21 of a roll-like plate material and an exposure section 25 for cutting the roll-like plate material like a sheet and punch means 30 for making plate cylinder engagement holes 14a and 14b in the left and right margins of the plate material along the transport direction thereof, the plate cylinder engagement holes to be engaged in protrusions 7a an 7b disposed in the circumferential direction of the left and right margins of the plate cylinder. Accordingly, it is possible to provide a plate making apparatus which reliably holds a plate material on a plate cylinder for enabling planographic printing and can use a roll-like plate material.

15 Claims, 21 Drawing Sheets

PLATE MATERIAL PLACEMENT APPARATUS AND METHOD

This is a divisional of application Ser. No. 09/289,945 filed Apr. 13, 1999 now U.S. Pat. No. 6,112,664, the disclosure of which is incorporated herein by reference.

BACKGROUND OF THE INVENTION

This invention relates to a plate making apparatus using a plate material having flexibility. In addition, this invention relates to a printing method, a printing apparatus, and a packing sheet material for a printing plate material according to a planographic printing technique. Further, this invention relates to a plate material placement method and a plate material placement apparatus for placing a plate material on a plate cylinder of a printing apparatus or a plate making apparatus.

In a planographic printing printing apparatus, generally a printing plate is wrapped around a plate cylinder and is fixed mechanically and printing is executed in this state.

However, a planographic printing plate with an easy-to-handle material other than metal (for example, plastic film, paper, etc.,) as a support has a drawback in dimension stability. For example, the plate warps partially by the friction between a blanket cylinder and the plate during printing and print dimensions and print position accuracy relative to paper are impaired.

Therefore, hitherto the plate using a support material as described above has been limited to simple use for printing a small number of sheets not much requiring register accuracy of printed matter and has not been used for high-grade printing of multicolor and elaborate printing or full-scale printing using a large printing apparatus.

To solve such a problem, Japanese Utility Model Unexamined Publication No. Sho. 58-1046 (JP-A-58-1046U) proposes a method of bonding a plate material directly to a plate cylinder or a preparatory form plate using an acrylic or rubber both-sided adhesive sheet or spray adhesive, for example.

However, in such a method, the printing plate is strongly bonded to the plate cylinder, thus a new problem occurs, namely, the position of the printing plate on the plate cylinder cannot be finely adjusted or workability of discharging the plate after print, etc., worsens extremely.

On the other hand, plate making and print method by CTP (computer to plate) finding spreading use in recent years have advantages that dimension, position accuracy of an image (exposure) relative to a plate material is good and that registration in multicolor printing is easy as compared with conventional plate making and printing method (exposure step of plate material is contact exposure using a lith type film).

However, the planographic printing plate having the support made of a plastic film, paper, etc., as described above involves the problems as described above, thus the advantage that registration in multicolor printing is easy in the CTP is not used fully.

On the other hand, hitherto, various techniques for placing a plate material on a plate cylinder of a printing apparatus, etc., have been known. FIGS. 23 and 24 show a printing plate placement apparatus 260 for placing a plate material on a plate cylinder of a printing apparatus. FIG. 24 is an X arrow view in FIG. 23 and FIG. 23 is a sectional view taken on line Y—Y in FIG. 24.

As shown in FIG. 23, a plate cylinder 261 of a printing apparatus has a shape such that a part of a column is cut in an axial direction of the column and that a groove part 265 is made in a roughly flat plane of the cut end, which will be hereinafter referred to as flat face part 261a. Provided in the groove part 265 are a plate front clamp mechanism 262 for clamping the plate front of the front end of a printing plate 270 and a plate back clamp mechanism 263 for clamping the plate back of the rear end of the printing plate 270. The clamp mechanism 262 (263) comprises a lower tooth 262b (263b) with the top face forming roughly the same flat face as the flat face part 261a and an upper tooth 262a (263a) being supported on the lower tooth for rotation and capable of clamping the plate front between the upper tooth and the top face of the lower tooth.

Peak parts 261c are formed between the flat face part 261a of the plate cylinder 261 and a curved surface part 261b. With some plate cylinders, peak parts may be formed between the lower tooth top face of clamp mechanism in place of the flat face part and curved surface part although not shown Normally, the portion where the flat face part 261a and the curved surface part 261b cross each other is rounded as a curved surface having a radius of 10 to 20 mm, but such a portion will also be called peak part in the specification.

As shown in FIG. 24, the lower tooth 262b of the plate front clamp mechanism is formed on the top with two positioning pins 264 spaced from each other in an axial direction of the plate cylinder 261. Notches 266 are formed at the positions of the upper tooth 262a of the plate front clamp mechanism corresponding to the positioning pins 264. Notches 271 are also formed at the positions of a plate front 270a of the printing plate 270 indicated by phantom lines in the figure corresponding to the positioning pins 264.

By the way, needs for plate materials made of inexpensive and easy-to-handle material other than metal, such as plastic film or paper, which will be called flexible plate materials in the specification, have grown with recent small lots and versatility of print matter. However, since such plate materials are highly flexible, several problems occur when the plate material is placed on a plate cylinder.

For example, in the printing plate placement apparatus 260, when the operator inserts the plate front 270a of the flexible printing plate 270 shown in FIG. 24 between the upper tooth 262a and the lower tooth 262b of the plate front clamp mechanism while holding the plate back 270b of the printing plate 270 and abuts the plate front against the two positioning pins 264, the plate front 270a may become deformed and be fixed in this deformed state. That is, in a plate cylinder on which a printing plate of a royal octavo or larger can be placed, the spacing between two positioning pins 264 becomes considerably wide and at the printing plate placing time, if the operator over pushes the flexible printing plate 270 even a little, the printing plate 270 becomes deformed so that the plate front 270a projects in the push direction from between the two positioning pins 264. However, if the printing plate 270 is pushed insufficiently for avoiding such deformation, it cannot be positioned accurately.

As shown in FIG. 23, the flexible printing plate 270 is hard to be conformable to the outer peripheral surface of the plate cylinder 261 and tends to float up from the outer peripheral surface of the plate cylinder in the proximity of the peak part 261c formed between the flat face part 261a and the curved surface part 261b of the plate cylinder 261.

To prevent such floating of the printing plate 270, while strongly pulling the plate back of the printing plate whose plate front is clamped in the plate front clamp mechanism 262, the operator rotates the plate cylinder and places the printing plate 270 thereon. At this time, however, the pulled part of the plate back of the flexible printing plate 270 is extended.

As in the example, the placeability of a flexible plate material on a plate cylinder is poor and it is difficult to always place a flexible plate material on a plate cylinder in a constant state. Therefore, if the flexible plate material is applied to multicolor printing (for example, four-color printing), etc., requiring a number of plate cylinders and accurate registration among the plate cylinders, an out-of-registration phenomenon occurs.

SUMMARY OF THE INVENTION

Accordingly, the object of the present invention is to solve the above-mentioned problem.

It is an object of the invention to provide a plate making apparatus which uses a planographic printing plate comprising a plastic film, paper, etc., as a support and reliably holds a plate material on a plate cylinder and accurately positions the plate material on the plate cylinder, thereby enabling multicolor planographic printing, and can use a roll-like plate material.

The object of the invention is accomplished by a plate making apparatus for forming an image on a flexible plate material made of a photosensitive material wound like a roll for making a plate, placing the made printing plate on a plate cylinder, and executing planographic printing in multiple colors, the plate making apparatus comprising a cutter being placed between a storage section of the plate material and an exposure section for cutting the roll-like plate material like a sheet and punch means for making plate cylinder engagement holes in the left and right margins of the plate material along the transport direction thereof, the plate cylinder engagement holes to be engaged in protrusions disposed in the circumferential direction of the left and right margins of the plate cylinder, the cutter and the punch means being formed in one piece.

The plate making apparatus of the invention cuts a roll-like plate material, makes plate cylinder engagement holes, and executes exposure at the same time or consecutively, so that the steps can be executed efficiently. Since exposure and printing are executed based on the same positioning reference holes, registration in multicolor printing is easy to perform.

In addition to this, it is also an object of the present invention to provide a printing method, a printing apparatus, and a packing sheet material for a printing plate material wherein a planographic printing plate comprising a plastic film, paper, etc., as a support is used, wherein the plate does not warp partially at the printing time and print position accuracy relative to the print dimensions and paper is not impaired, wherein registration in multicolor printing is easy in plate making and print method by CTP, and wherein worsening of workability at the printing time, the problem in the related art, can be solved.

The object of the invention is accomplished by the following:

(1) A printing apparatus using a flexible plate material for executing planographic printing, wherein the surface roughness of a plate cylinder on which the plate material is placed is formed as a coarse face with center line average roughness Ra ranging from 3 $\mu$m to 12 $\mu$m.

(2) A printing method using a flexible plate material for executing planographic printing, wherein printing is executed using a substance wherein the surface roughness of at least either of a surface of a plate cylinder on which the plate material is placed and a rear face of the plate material is formed as a coarse face with center line average roughness Ra ranging from 3 $\mu$m to 12 $\mu$m.

(3) A packing sheet material for a planographic printing plate material comprising a sheet-like base substance wherein the surface roughness of at least one face of the base substance is formed as a coarse face with center line average roughness Ra ranging from 3 $\mu$m to 12 $\mu$m.

(4) A printing method wherein the material in the above-mentioned item (3) is installed on a plate cylinder so that the coarse face side of the material is placed on the planographic printing plate material side.

Note that in the case where the surface roughness of the coarse face is equal to or more than 3 $\mu$m, projected portions formed on the coarse face can be eaten into the plate material, to thereby obtain an effect suppressing a strain/warp (extension) of the plate material.

If the surface roughness of a coarse face is less than 3 $\mu$m as center line average roughness Ra, a warp (extension) suppression effect of a plate material can be little expected and if the surface roughness is larger than 12 $\mu$m as center line average roughness Ra, protrusions affect the surface of the plate material, causing an image defect to occur on print matter.

Furthermore, it is also an object of the present invention to provide a plate material placement method and a plate material placement apparatus which are capable of placing a flexible plate material on a plate cylinder reliably and easily and can also be realized by adding some improvement to an already installed printing apparatus, etc.

The object of the invention is accomplished by the following:

(1) A plate material placement method for placing a flexible plate material on a plate cylinder comprising a plate front clamp mechanism and a plate back clamp mechanism each having an upper tooth and a lower tooth, the method comprising the steps of:

inserting a plate front of the plate material between the upper tooth and the lower tooth of the plate front clamp mechanism and abutting the plate front against at least three positioning pins projected from the lower tooth for positioning and fixing the plate front;

providing a press roller;

winding the plate material around the plate cylinder while pressing the plate material against the outer peripheral surface of the plate cylinder by the press roller before and after at least a peak part of the outer peripheral surface of the plate cylinder; and inserting a plate back of the plate material between the upper tooth and the lower tooth of the plate back clamp mechanism with the neighborhood of the plate back bent and fixing the plate back.

(2) A plate material placement method for placing a flexible plate material on a plate cylinder comprising a plate front clamp mechanism and a plate back clamp mechanism each having an upper tooth and a lower tooth, the method comprising the steps of:

attaching a pin abutment member having higher rigidity than the plate material to a positioning pin projected from the lower tooth and fixedly securing the plate front of the plate material to the pin abutment member at the same time as inserting the plate front of the plate material between the upper tooth and the lower tooth of the plate front clamp mechanism, thereby positioning and fixing the plate material;

providing a press roller;

winding the plate material around the plate cylinder while pressing the plate material against the outer peripheral surface of the plate cylinder by the press roller in adjacent to at least a peak part of the outer peripheral surface of the plate cylinder; and inserting and fixing a plate back of the plate material between the upper tooth and the lower tooth of the plate back clamp mechanism while a portion of the plate material adjacent to the neighborhood of the plate back is being bent.

(3) A plate material placement method for placing a flexible plate material on a plate cylinder comprising a plate front clamp mechanism and a plate back clamp mechanism each having an upper tooth and a lower tooth, the method comprising the steps of:

fixedly securing a pin abutment member having higher rigidity than the plate material to a plate front of the plate material, inserting the plate front of the plate material between the upper tooth and the lower tooth of the plate front clamp mechanism, abutting the pin abutment member against a positioning pin projected from the lower tooth, and positioning and fixing the plate front;

providing a press roller;

winding the plate material around the plate cylinder while pressing the plate material against the outer peripheral surface of the plate cylinder by the press roller in adjacent to at least a peak part of the outer peripheral surface of the plate cylinder; and inserting and fixing a plate back of the plate material between the upper tooth and the lower tooth of the plate back clamp mechanism while a portion of the plate material adjacent to the neighborhood of the plate back is being bent.

(4) A plate material placement apparatus for placing a flexible plate material on a plate cylinder comprising a plate front clamp mechanism and a plate back clamp mechanism each having an upper tooth and a lower tooth, the apparatus comprising:

a press roller for pressing the plate material against the outer peripheral surface of the plate cylinder in adjacent to at least a peak part of the outer peripheral surface of the plate cylinder, wherein at least three positioning pins against which a plate front of the plate material is abutted for positioning the plate front are placed on the lower tooth of the plate front clamp mechanism in a predetermined spacing in an axial direction of the plate cylinder.

(5) A plate material placement apparatus for placing a flexible plate material on a plate cylinder comprising a plate front clamp mechanism and a plate back clamp mechanism each having an upper tooth and a lower tooth, the apparatus comprising:

a press roller for pressing the plate material against the outer peripheral surface of the plate cylinder in adjacent to at least a peak part of the outer peripheral surface of the plate cylinder; and a pin abutment member having higher rigidity than the plate material, to which a plate front of the plate material is fixedly secured, for abutting a positioning pin placed on the lower tooth of the plate front clamp mechanism, thereby positioning the plate material.

(6) The plate material placement apparatus in the above-mentioned item (4) or (5) further including guide members for guiding the plate front of the plate material into the plate front clamp mechanism.

(7) The plate material placement apparatus in any one of the above-mentioned items (4) to (6) wherein the width of one of the positioning pins in the axial direction of the plate cylinder is formed wider than that of each of other positioning pins in the axial direction of the plate cylinder.

(8) The plate material placement apparatus in any one of the above-mentioned items (4) to (7) further including means for rotating the plate cylinder, means for detecting a rotation position of the plate cylinder, and means for stopping rotating the plate cylinder at a predetermined position when the plate material is placed.

(9) The plate material placement apparatus in any one of the above-mentioned items (4) to (8) wherein a packing sheet material comprising a sheet-like base substance with at least one face formed as a coarse face is wound around the plate cylinder so that the coarse face becomes the surface side.

(10) The plate material placement apparatus in any one of the above-mentioned items (4) to (8) wherein a packing sheet material comprising a sheet-like base substance with at least one face formed as an adhesive face is wound around the plate cylinder so that the adhesive face becomes the surface side.

According to (1) and (4), the plate front of the flexible plate material is abutted against the three or more positioning pins and is positioned, thus the spacing between the positioning pins becomes narrow and the plate material does not become deformed in such a manner that the plate front projects from between the positioning pins. When the plate material is wound around the plate cylinder, the press roller presses the plate material against the outer peripheral surface of the plate cylinder in the proximity of the peak part of the outer peripheral surface of the plate cylinder (peak part on the plate front clamp mechanism side and peak part on the plate back clamp mechanism side), so that the plate material does not float up from the outer peripheral surface of the plate cylinder. Therefore, the placement property of a flexible plate material on the plate cylinder improves remarkably and a load can be taken off the operator.

According to (2), (3), and (5), the plate front of the plate material is protected by the highly rigid pin abutment member for preventing the plate front from becoming deformed. Therefore, the number of the positioning pins need not be increased and the method or apparatus can be applied comparatively easily to already installed printing apparatuss and plate making apparatus. Metal, etc., can be selected as the material of the pin abutment member having higher rigidity than the plate material, but the material is not limited.

According to (6), when the plate material is set on the guide means, it is guided into the plate front clamp mechanism by the guide means. Therefore, insertion of the plate front of the plate material between the upper tooth and lower tooth of the plate front clamp mechanism is simplified.

According to (7), the plate material is formed with as many notches, etc., as the number of positioning pins, each notch, etc., whose inner peripheral surface engages one positioning pin having a wider width closely, whereby after the plate material is engaged in the wider positioning pin, it can be engaged in other positioning pins easily. Therefore, the placement property of a plate material can be enhanced without impairing the positioning accuracy of the plate material.

According to (8), the operator need not rotate or stop the plate cylinder at the plate material placing time. Therefore, a load can be furthermore taken off the operator and the plate material can be placed on the plate cylinder rapidly.

According to (9) and (10), the packing sheet material supports the plate material put thereon by a high frictional force or high adhesion. Therefore, the dimension stability of the plate material after the plate material is placed on the plate cylinder can be improved. When the plate material is placed on the plate cylinder, a shift of the plate material on the outer peripheral surface of the plate cylinder can be prevented reliably.

Japanese Patent Unexamined Publication No. Sho. 63-191636 (JP-A-63-191636) discloses a plate back insertion apparatus of a sheet printing apparatus comprising a roller for pressing a printing plate against the outer peripheral surface of a plate cylinder. However, the apparatus is intended for printing plates made of metal and does not consider a problem occurring when a flexible printing plate is mounted. For example, the gazette does not disclose technical idea for abutting the plate front of a printing plate against three or more positioning pins to suppress deformation of the plate front or fixedly securing a pin abutment member having higher rigidity than a printing plate and abutting the pin abutment member against a positioning pin or technical idea for pressing a printing plate against the outer peripheral surface of a plate cylinder by a roller in adjacent to the peak part of the outer peripheral surface of the plate cylinder.

Japanese Utility Model Unexamined Publication No. Hei. 6-71130 (JP-A-6-71130U) discloses a printing plate auto placement apparatus comprising a back push roller for pressing a flexible printing plate against a plate cylinder, but does not disclose the technical idea according to the invention described above either. The plate back clamp mechanism of the printing plate auto placement apparatus disclosed in the JP-A-6-71130U can pull the plate back with the plate back clamped.

In the invention, the press roller presses a plate material against the outer peripheral surface of the plate cylinder in adjacent to the peak part of the outer peripheral surface of the plate cylinder, so that the plate material is brought into intimate contact with the plate cylinder without pulling the plate back when the plate back clamp mechanism clamps the plate back. Therefore, the plate back clamp mechanism in the invention may or may not be able to pull the plate back.

DETAILED DESCRIPTION OF THE PREFERRED EMBODIMENTS

Figure 1:
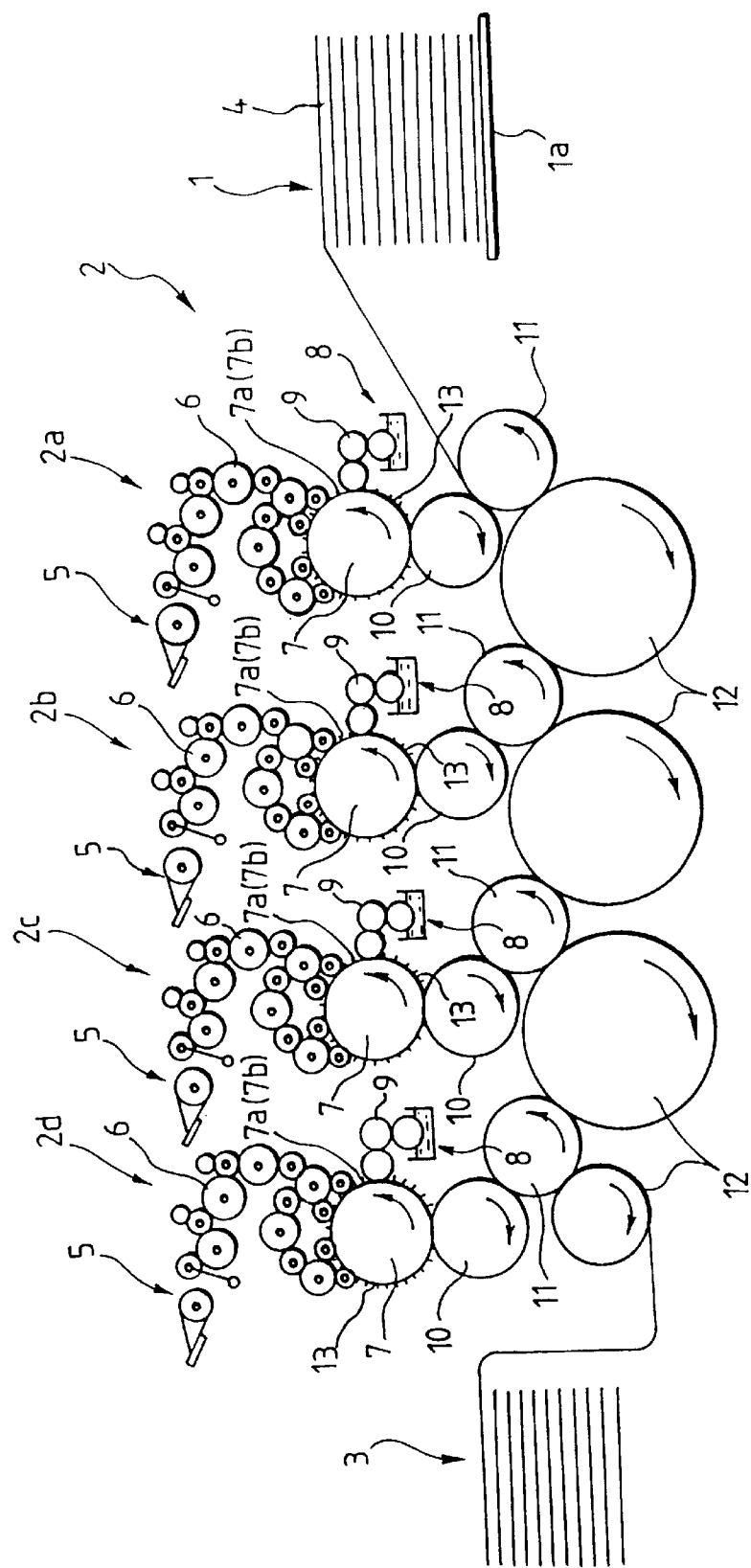
FIG. 1 is a conceptual drawing to show a multicolor planographic printing apparatus according to the invention.

FIG. 1 shows a multicolor planographic printing apparatus of one embodiment of the invention. This planographic printing apparatus is made up of a paper feed section 1, a print section 2, a paper discharge section 3, etc. Sheets of paper 4 piled on a pallet 1a in the paper feed section 1 are transported one sheet at a time to print units 2a, 2b, 2c, and 2d of the print section 2 in order where printing is executed in four colors of black, cyan, magenta, and yellow. In each of the print units 2a, 2b, 2c, and 2d, ink is supplied from an ink device 5 via an ink roll 6 to a plate material (press plate) 13 placed on a plate cylinder 7 and is deposited on printing image areas and water is supplied to the plate material 13 via a moistening water roll (fountain solution roll) 9 from a wetting device 8 and is applied to a non-printing image area portion of the plate material 13. The ink on the printing image areas of the plate material 13 is transferred to a rubber cylinder 10 and paper 4 supplied to the nip between the rubber cylinder 10 and a press cylinder 11 is printed. At the termination of printing in one print unit, the paper 4 is transported to the next print unit by means of a paper passing cylinder 12. The paper 4 whose print is thus complete in the print section 2 is transported to the paper discharge section 3.

In the embodiment, the method of using a planographic printing plate using moistening water (fountain solution) has been described as a representative example, but the scope of the invention is not limited to it and also contains a method of using a planographic printing plate using no moistening water.

Figure 2:
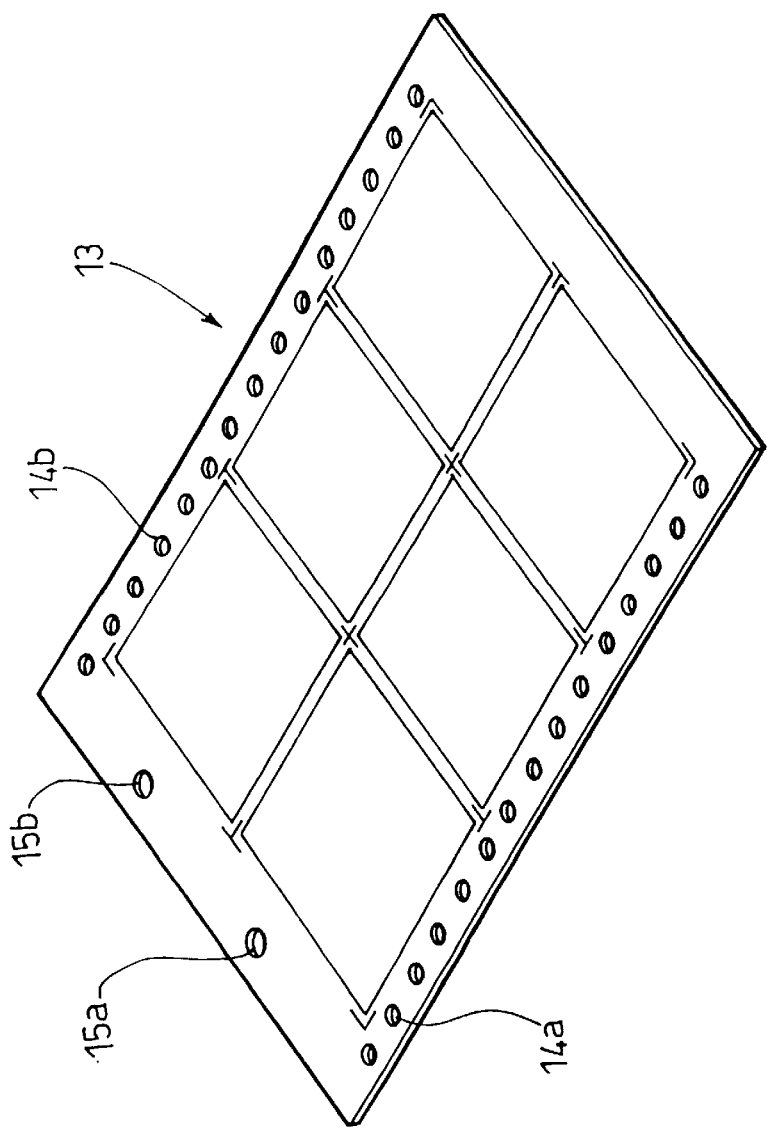
FIG. 2 is a conceptual perspective view to show a plate material used with the multicolor offset printing apparatus in FIG. 1.

In the planographic printing apparatus of the embodiment, the plate cylinder 7 is formed in both side margins with protrusions 7a and 7b in the circumferential direction. On the other hand, as shown in FIG. 2, the plate material (press plate) 13 used with the planographic printing apparatus is formed in left and right margins with plate cylinder engagement holes 14a and 14b along the transport direction. The plate cylinder engagement holes 14a and 14b in the plate material 13 are engaged in the protrusions 7a and 7b on the plate cylinder 7, whereby the plate material 13 is held on the plate cylinder 7.

Further, exposure reference holes 15a and 15b described later are made in the leading end part of the plate material 13.

Figure 3:
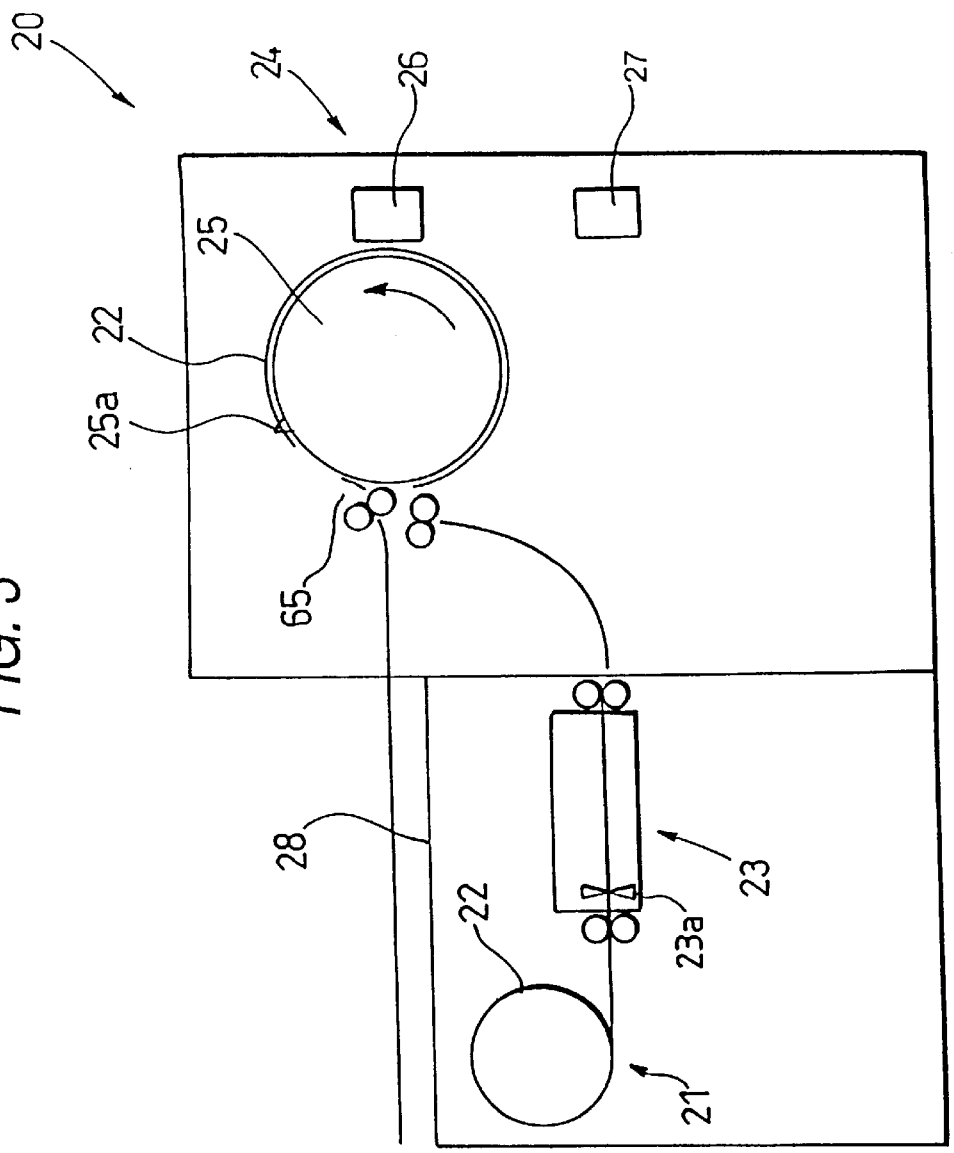
FIG. 3 is a conceptual drawing to show a plate making apparatus of the plate material in FIG. 2.
Figure 4:
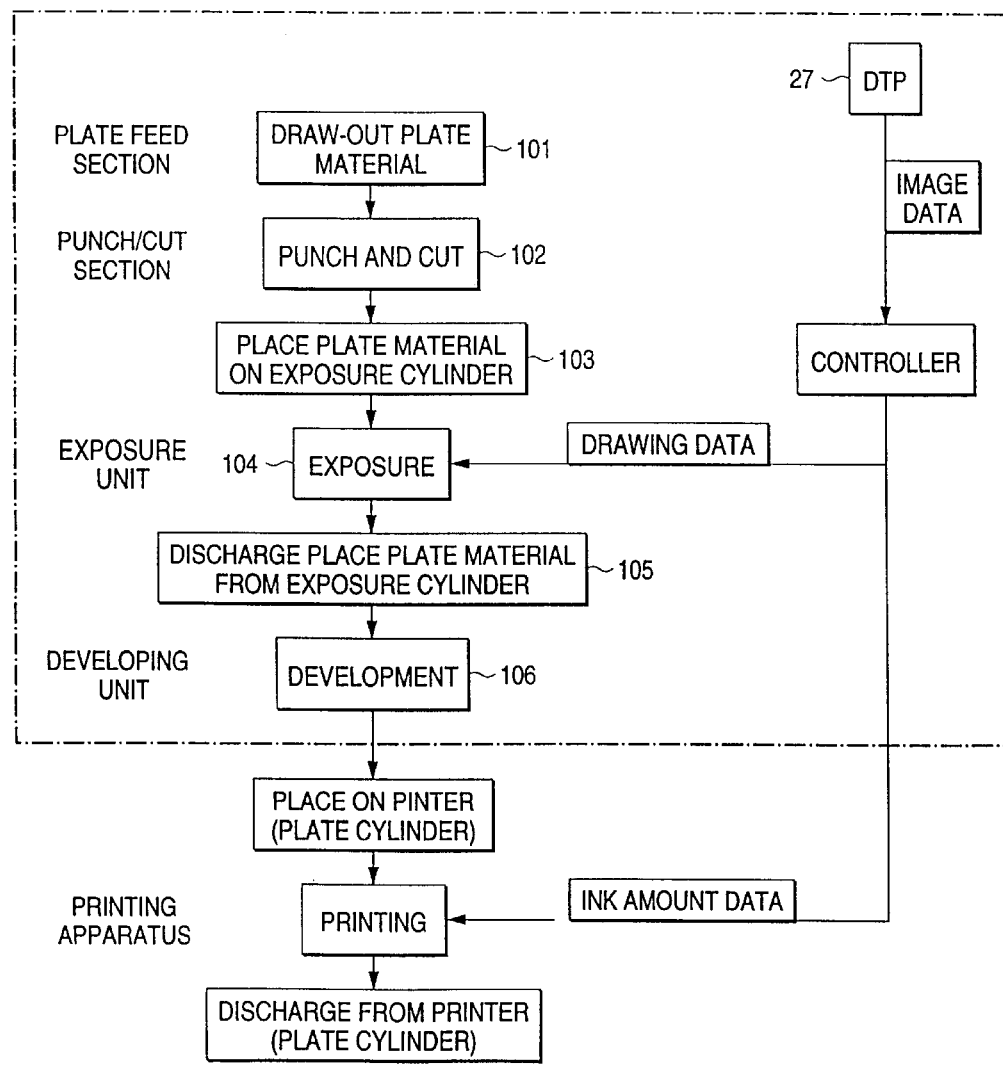
FIG. 4 is a chart to shows an operation procedure of the plate making apparatus shown in FIG. 3.

FIG. 3 shows a plate making apparatus 20 of the plate material 13 and FIG. 4 shows a plate making procedure. In the plate making apparatus 20, a plate material 22 made of a photosensitive material like a roll, stored in a plate material (photosensitive material) storage section 21 is drawn out at step 101 and plate cylinder engagement holes 14a and 14b are punched in a punch section 23 and the plate material 22 is cut to desired dimensions at step 102. Next, the plate material 22 is transported to an exposure cylinder 25 of an exposure section 24, exposure reference holes 15a and 15b in the leading end part of the plate material 22 (see FIG. 2) are engaged in exposure reference pins 25a and 25a in the exposure cylinder 25, and registration is performed, then the plate material 22 is fixed and placed on the exposure cylinder 25 by a known method of clamp, vacuum, etc., at step 103. As the exposure cylinder 25 rotates, the plate material 22 is rotated and when it passes through a laser image output unit 26, printing image areas are drawn on the plate material 22 by laser light output based on image data from a DTP (desktop publishing) system 27 at step 104. The plate material 22 is stripped off from the exposure cylinder 25 at step 105 and is developed at step 106, then is discharged onto a plate discharge bed 28. The exposure and developing methods are not limited.

In the embodiment, two exposure reference pins 25a and 25a in the exposure cylinder 25 are provided, but the scope of the invention is not limited to the two exposure reference pins. For example, pins similar to the protrusions 7a and 7b on the plate cylinder 7 may be provided so as to engage the plate cylinder engagement holes 14a and 14b in the circumferential direction of the exposure cylinder 25.

Figure 5:
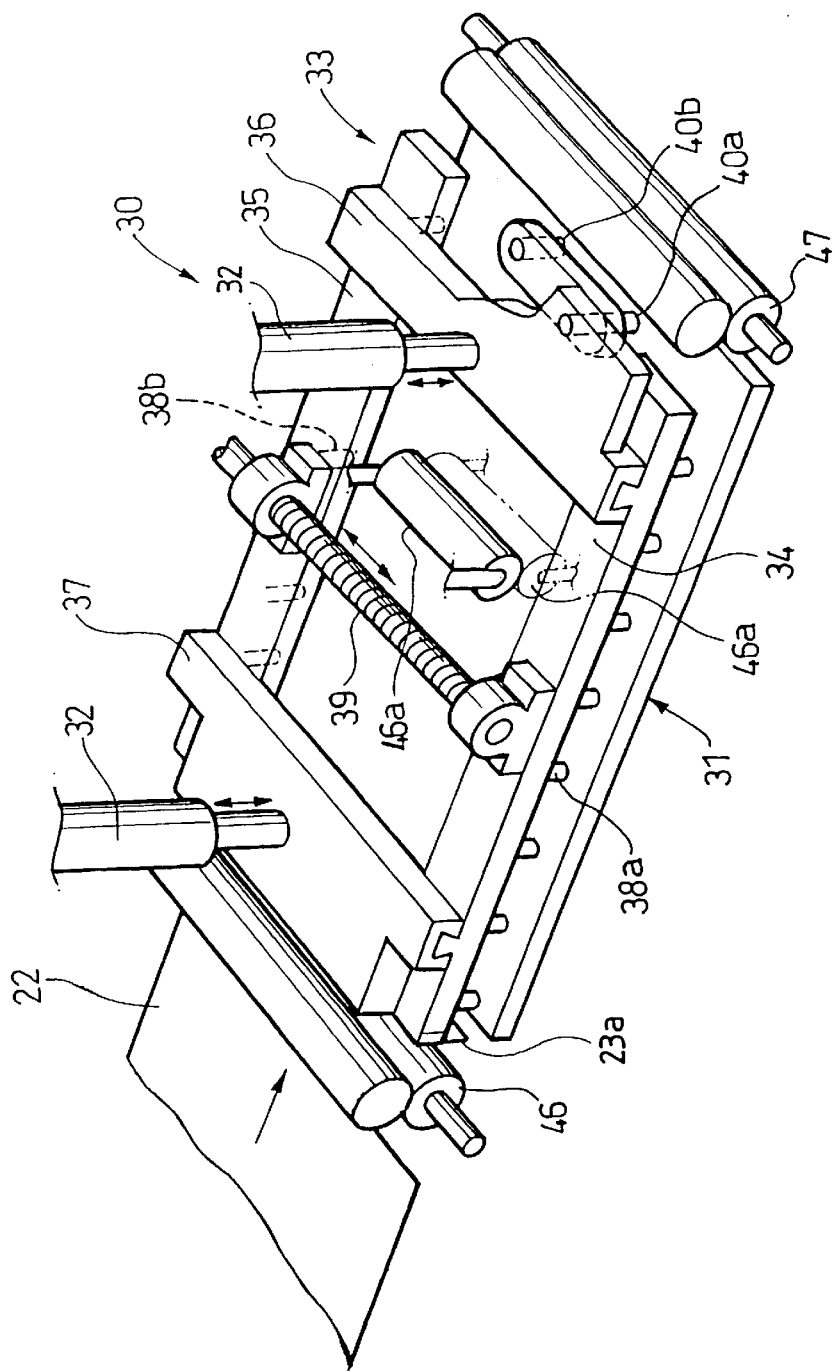
FIG. 5 is a conceptual perspective view to show a punch used with a punch section in the plate making apparatus shown in FIG. 3.

FIG. 5 shows a punch 30 in the punch section 23 of the plate making apparatus 20. The punch 30 is placed on a transport passage of the plate material 22 and comprises a reception bed 31 forming a part of the transport passage and a frame bed 33 placed above the reception bed 31 and moved up and down by fluid pressure cylinders 32. The frame bed 33 has left and right frames 34 and 35, which are coupled with guide rails 36 and 37 in a dovetail groove manner as shown in FIG. 5 and are held in parallel and movable toward and away from the reception bed 31. The frames 34 and 35 are formed on the lower faces with pins 38a and 38b for punching the plate cylinder engagement holes 14a and 14b (see FIG. 2) at equal intervals along the length direction of the frames. A screw rod 39 is placed across the frames 34 and 35. It is supported on one frame 34 for rotation and is threadably engaged with the other frame 35. Therefore, the spacing between both frames 34 and 35 can be adjusted by turning the screw rod 39.

The punch 30 comprises a cutter 23a in the rear end part of the guide rail 37. A pair of transport rolls 46 for supplying the plate material 22 to the reception bed 31, a pair of transport rolls 46a for transporting the plate material 22 on the reception bed 31, and a pair of transport rolls 47 for discharging the plate material 22 from the reception bed 31 are disposed at the rear end, the middle, and the front end of the reception bed 31.

In the punch section 23 of the plate making apparatus 20 comprising the described punch 30, in the initial state of plate making work, the left and right frames 34 and 35 are moved up by the fluid pressure cylinders 32 and the paired transport rolls 46a abut by the action of a fluid pressure cylinder (not shown)

In the state, when the plate material 22 is transported to the reception bed 31 by means of the transport rolls 46, it is sandwiched between the transport rolls 46a and is transported. The plate material 22 stops at a constant position and is positioned by positioning means (not shown). Next, the fluid pressure cylinder (not shown) operates and moves the transport rolls 46a up and down and the fluid pressure cylinders 32 are operated for moving the frames 34 and 35 down, thereby punching plate cylinder engagement holes 14a and 14b in the plate material 22 (plate material 13) by means of the pins 38a and 38b. Upon completion of the punching, the fluid pressure cylinders 32 are operated for moving the frames 34 and 35 up. Next, the plate material 22 is transported to the exposure cylinder 25 (see FIG. 3) by means of the transport rolls 46a which come in contact with each other by the fluid pressure cylinder (not shown) and the transport rolls 47 which come in contact with each other by fluid pressure cylinder (not shown).

In the described punch 30, the transport rolls 46, 46a, and 47 are disposed at the rear end, the middle, and the front end of the reception bed 31 for supplying the plate material 22 to the reception bed 31 and discharging the plate material 22 from the reception bed 31. However, if the reception bed 31 is formed of a belt conveyor or is placed at the punch position and a belt conveyor is disposed except at the punch position, the transport rolls 46, 46a, and 47 are not necessarily required.

At the punching time, the plate material 22 may be fixed to the reception bed 31 by means of vacuum, etc.

More than one set of the exposure reference pins 25a of the exposure cylinder 25 may be provided corresponding to the used plate size (width), in which case pins other than those corresponding to the used plate size may be made to be able to be buried.

The exposure reference pins 25a may be provided at positions not corresponding to the engagement holes; for example, they may be provided at the positions corresponding to the exposure reference holes 15a and 15b in the plate material as shown in FIG. 2, in which case exposure reference punch pins 40a and 40b may be provided at the guide rail 36 of the punch 30.

Figure 6:
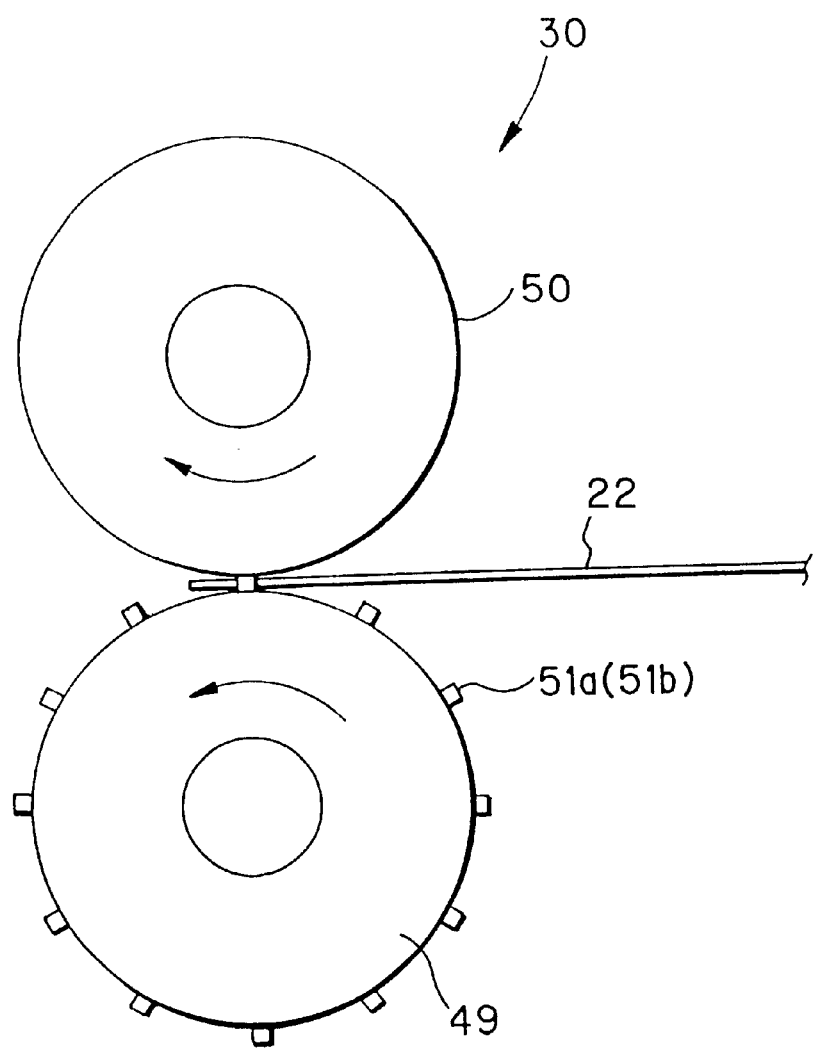
FIG. 6 is a conceptual drawing to show another form of the punch used with the punch section in the plate making apparatus shown in FIG. 3.

FIG. 6 shows another form of the punch 30. The punch 30 shown in FIG. 6 is made up of a punch roller 49 and a reception roller 50. Pins 51a and 51b are placed on left and right margins of the peripheral surface of the punch 30 at equal intervals in the circumferential direction for punching plate cylinder engagement holes 14a and 14b (see FIG. 2) in the left and right margins of the plate material 22 passing through the nip between both the rollers 49 and 50. Pins for punching exposure reference holes 15b (see FIG. 2) may be placed on the punch roller 49.

Figure 7:
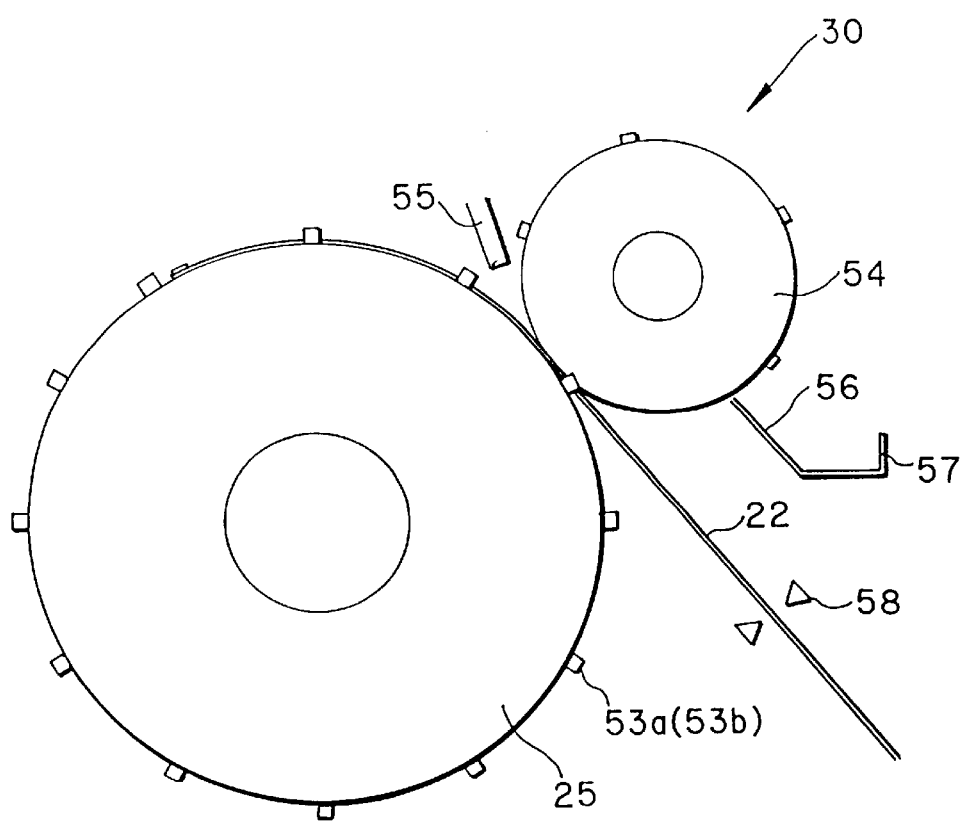
FIG. 7 is a conceptual drawing to show still another form of the punch used with the punch section in the plate making apparatus shown FIG. 3.

FIG. 7 shows still another form of the punch 30. In the punch 30 shown in FIG. 7, pins 53a and 53b for punching plate cylinder engagement holes 14a and 14b (see FIG. 2) are placed on the peripheral surface of the exposure cylinder 25 and a reception roller 54 is provided facing the exposure cylinder 25. Further, a suction nozzle 55 is disposed in the proximity of the abutment part of the exposure cylinder 25 and the reception roller 54 for sucking chips of the punched plate material 22, and the remaining chips are scraped in a vessel 57 by a blade 56. Also in the punch 30 like that shown in FIG. 6, pins for punching exposure reference holes 15b (see FIG. 2) may be placed on the exposure cylinder 25. In the punch 30 in FIG. 7, a cutter 58 for cutting the rear end of the plate material 22 is disposed separately from the exposure cylinder 25.

The plate material 22 is comparatively firm and if fixing means is released, the plate material 22 floats up from the peripheral surface of the exposure cylinder 25. Thus, a stripping-off claw 65 (see FIG. 3) is provided, whereby the plate material 22 can be peeled off the exposure cylinder 25.

A plate is made by the described plate making apparatus 20 according to the plate making procedure as plate material 13. The plate material 13 is held on the plate cylinder 7 of the planographic printing apparatus and printing is executed.

In the embodiment, the offset printing apparatus and the plate making apparatus are shown separately, but the plate making apparatus can also be built in the offset printing apparatus so as to execute plate making and printing in series.

Figure 8:
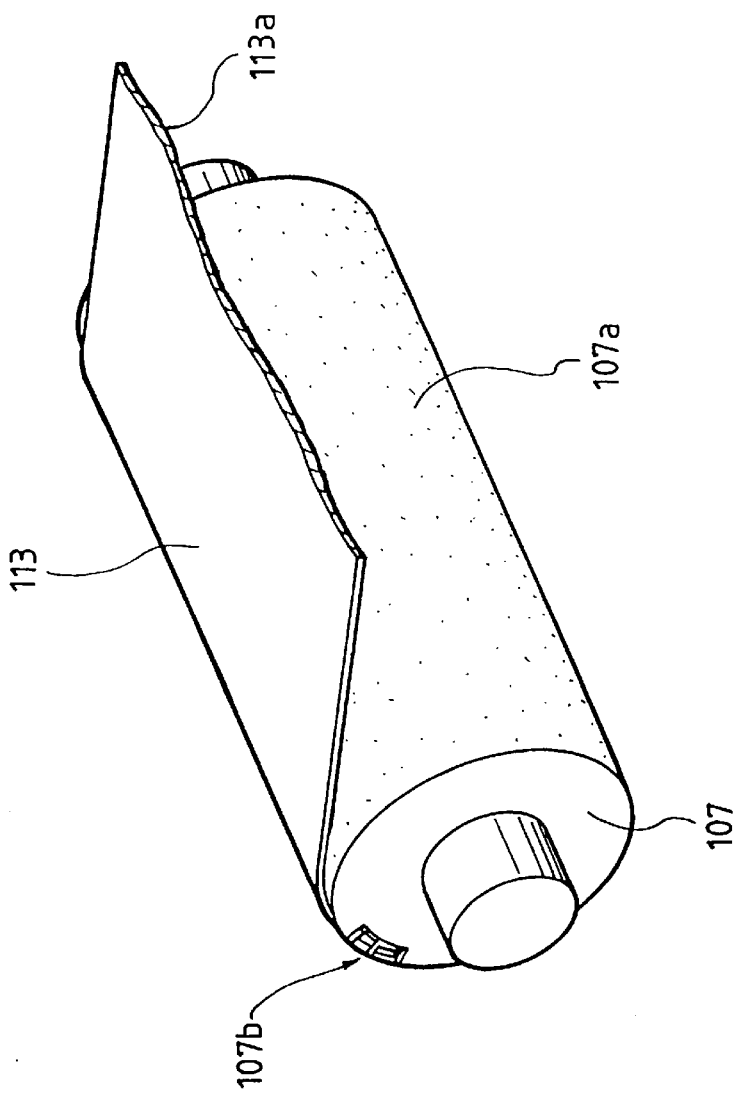
FIG. 8 shows the main part of printing apparatus of the invention and is a conceptual perspective view to show one embodiment of a plate cylinder and a plate material.

By the way, in the planographic printing apparatus of one embodiment of the invention, at least either of a surface 107a of the plate cylinder 107 and a rear face 113a of the plate material 113 is made a coarse face, as shown in FIG. 8. The surface roughness of the coarse face is set in the range of 3 μm to 12 μm as center line average roughness Ra, because if the surface roughness is less than 3 μm, a warp (extension) suppression effect of a plate material cannot be provided and if the surface roughness is larger than 12 μm, protrusions affect the plate surface, causing an image defect to occur on print matter.

Note that a center line average roughness(centerline average height) Ra of a seat material can be measured in accordance with JIS B0601. For example, the center line average roughness designated "Ra" with a micrometer unit/order can be calculated in accordance with a following equation (1):

$$Ra = \frac{1}{L} \int_0^L |f(x)| dx \quad (1)$$

where L is a measurement length of selected portion in a center line direction thereof which is selected from a measured sectional curve, and a roughness curve is represented by "y=f(x)" when x is a value on a X-axis corresponding to a center line of the selected portion, and y is a value on a Y-axis corresponding to a direction of a height magnification.

The surface roughness of a plate cylinder in a related art is formed about 0.4 μm or less as center line average roughness Ra.

Available as a formation method of such a coarse face is a method of applying and drying a liquid comprising minute particles dispersed in a binder, a method of pushing minute particles into a binder by mechanical pressure after binder film formation, a method of electrode positing minute particles after binder film formation, a method of forming a coarse face by blasting and rolling by a rolling roll formed with minute protrusions, a method of forming a coarse face by metal spraying, electric discharge machining, laser beam machining, photo-resist application, exposing of a minute protrusion pattern, developing, removing of the resist, and etching, or the like.

In the described offset printing apparatus, the front and rear ends of the plate material 113 are retained by claws 107b of the plate cylinder 107 and the plate material 113 is placed on the plate cylinder 107. At printing, if the plate material 113 is pressurized by the press cylinder 11, it is held on the plate cylinder 107 without being shifted from the plate cylinder 107 because of the presence of the coarse face of at least either of the surface 107a of the plate cylinder 107 and the rear face 113a of the plate material 113.

Figure 9:
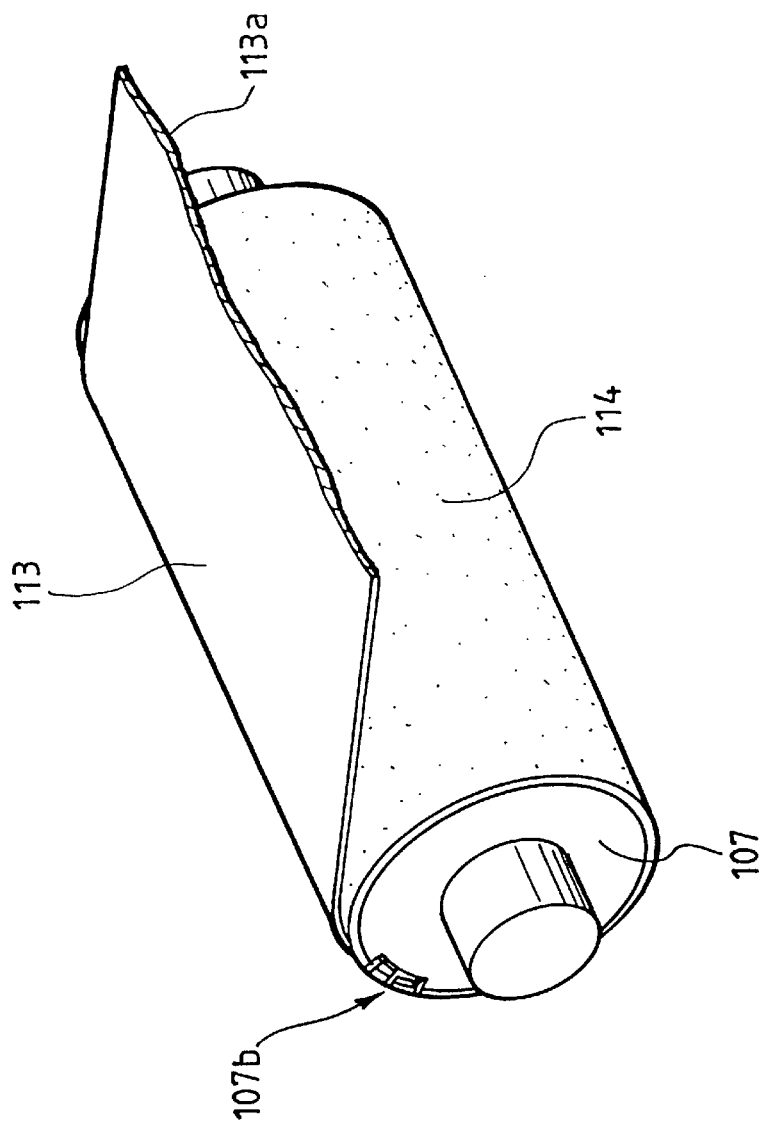
FIG. 9 shows the main part of printing apparatus of the invention and is a conceptual perspective view to show another embodiment of a plate cylinder on which a packing sheet is placed.

FIG. 9 shows an other embodiment according to the invention. At least one face of a packing sheet material for planographic plate material (hereinafter referring a planographic plate material packing sheet material) 114 placed on the peripheral surface is formed as a coarse face. The planographic plate material packing sheet material 114 is fixed to the plate cylinder 107 by a method (not shown) so that the coarse face comes in contact with a planographic printing plate 113.

The base substance used for the planographic plate material packing sheet material 114 may be a substance well fitted to the plate cylinder 107 of printing apparatus, such as plastic of polyethylene teiephthalate, polypropylene, polyethylene, etc., metal of aluminum, SUS, etc., paper, synthetic paper, or cloth.

A method of using an adhesive or an adhesive material such as spray paste or double-sided tape, a method of providing claws for fixing the head of the plate cylinder and the planographic plate material packing sheet material and retaining the front end or the front and rear ends of the planographic plate material packing sheet material by means of the claw, or a method using the methods in combination may be used as the method of fixing the planographic plate material packing sheet material 114 to the plate cylinder 107.

The surface roughness of the coarse face, the coarse face formation method, the plate placement method, and the like are the same as those in the one embodiment.

EXAMPLES

The invention will be discussed in more detail with examples of the other embodiment of the invention.

Samples (1) to (4) are provided as follows:

Sample (1)

Five types of glass balls listed in Table 2 with prescription listed in Table 1 (manufactured by Union Co., Ltd.) and an acrylic resin (manufactured by Fuji Photo Film Co., Ltd.; Tg=37° C., 40% toluene solution) as a binding agent with the glass balls were dispersed on a lumilar film (manufactured by Tore Co. Ltd.) as abase substance in toluene with an excel auto homogenizer (manufactured by Nihon Seiki Co., Ltd.) for 15 minutes at 12,000 rpm, then were applied and dried with a wire bar to the dry application amount 10 g/m², providing a packing sheet sample.

Table 1 lists the prescription of the prepared application material.

Table 2 lists the used glass balls and average particle diameters.

TABLE 1

| | Prescription (g) | |
|---|---|---|
| Glass ball | Resin solution | Toluene |
| 12 | 10 | 20 |

TABLE 2

| Sample No. | Used part No. | Blend ratio | Average particle diameter (μm) | Standard deviation (μm) |
|---|---|---|---|---|
| (1)-1 | UBS-0020 L | | 17 ± 15 | 10 |
| (1)-2 | UB-03 L | | 40 ± 15 | 10 |
| (1)-3 | UB-34 L | | 58 ± 15 | 15 |
| (1)-4 | UBS-0020 L: UB-34 L | 1000:1 | — | — |
| (1)-5 | UBS-0020 L: UB-34 L | 100:1 | — | — |

Sample (2)

Eight types of water-resistant abrasive paper listed in Table 3 (manufactured by Nihon Kenshi). The material of used abrasive grains is black silicon carbide.

Table 3 lists the grain sizes of the used water-resistant abrasive paper.

TABLE 3

| Sample No. | Grain Size |
|---|---|
| (2)-1 | #240 |
| (2)-2 | #320 |
| (2)-3 | #500 |
| (2)-4 | #600 |
| (2)-5 | #800 |
| (2)-6 | #1000 |
| (2)-7 | #1200 |
| (2)-8 | #2000 |

Sample (3)

Glass ball application sheet SUPER ICP FILM S type (manufactured by Shinoda Shouji Co., Ltd.), glass ball average particle diameter 50 μm.

The center line average roughness on the particle application side of each of the above-described samples was measured with a 570A model surface roughness form measuring instrument manufactured by Tokyo Seimitu Co., Ltd.

Table 4 lists the center line average roughness on the particle application side of each sample.

TABLE 4

| Sample No. | Center line average roughness (μm) |
|---|---|
| (1)-1 | 3.9 |
| (1)-2 | 7.1 |
| (1)-3 | 11.5 |
| (1)-4 | 3.9 |
| (1)-5 | 4.0 |
| (2)-1 | 16.0 |
| (2)-2 | 12.3 |
| (2)-3 | 7.7 |
| (2)-4 | 6.0 |
| (2)-5 | 4.7 |
| (2)-6 | 3.2 |
| (2)-7 | 3.0 |

TABLE 4-continued

| Sample No. | Center line average roughness (μm) |
|---|---|
| (2)-8 | 2.3 |
| (3) | 6.6 |

Sample (4)

Polyester film as comparison reference for checking plate extension suppression effect of coarse face material.

To measure plate extension at the printing time, a DAIYA1F1 two-color offset sheet rotary press manufactured by Mitubishi Heavy Industry Co., Ltd. was used. A planographic printing plate with an aluminum support free of plate extension was placed on the first-color plate cylinder of the press by a standard method.

On the other hand, a packing sheet and a printing plate were placed on the second-color plate cylinder of the press in the following two manners:

a) Spray paste (manufactured by 3M Co., Ltd.) was applied to the side opposite to the particle application side of each of samples (1) to (3) described above as a packing sheet material, then the packing sheet material was put on the plate cylinder and ELP-2X master 0.2 mm thick (manufactured by Fuji Photo Film Co., Ltd.), which is a planographic printing plate with a laminate support of paper and polyethylene, was placed on the packing sheet material by the standard method.

b) Sample (4) mentioned above was placed as a packing sheet material and the above-mentioned ELP-2X master was placed as a plate material by the standard method.

The thickness of each of the samples was adjusted so that the print pressure becomes a standard condition.

After 1000 sheets of paper were printed, plate extension since the printing start time was measured on the printed coated paper. To measure the plate extension, exposure was executed at the same position on the first-color and second-color plate cylinders and six dragonflies placed back and forth and left and right were printed with the first and second colors slightly shifted in the rotation direction of the plate cylinders and the dragonfly spacing at each of the six positions in the first and second colors in the plate cylinder rotation direction on print matter was measured on the start print matter and the print matter after the 1000 sheets of paper, then the difference was assumed to be the plate extension amount at the position and the average value of the plate extension amounts at the six positions was assumed to be the plate extension amount of the plate.

On the other hand, under the condition where the surface roughness of a sample is large, an image loss on print matter occurs and the sample cannot be used from the viewpoint of the quality of print matter. Thus, the image loss degree on print matter was evaluated by visual inspection.

Table 5 lists the plate extension amounts after printing 1000 sheets of paper and the evaluation results of the image loss degree on print matter by visual inspection.

TABLE 5

| Sample No. | Center line average roughness (μm) | Plate extension | Image loss |
|---|---|---|---|
| (2)-8 | 2.3 | X | ◯ |
| (2)-7 | 3.0 | Δ | ◯ |
| (2)-6 | 3.2 | Δ | ◯ |
| (1)-1 | 3.9 | ◯ | ◯ |

TABLE 5-continued

| Sample No. | Center line average roughness (μm) | Plate extension | Image loss |
|---|---|---|---|
| (1)-4 | 3.9 | ○ | ○ |
| (1)-5 | 4.0 | ○ | ○ |
| (2)-5 | 4.7 | ○ | ○ |
| (2)-4 | 6.0 | ○ | ○ |
| (3) | 6.6 | ○ | Δ |
| (1)-2 | 7.1 | ○ | Δ |
| (2)-3 | 8.0 | ○ | Δ |
| (1)-3 | 11.5 | ○ | Δ |
| (2)-2 | 12.0 | ○ | Δ |
| (2)-1 | 16.0 | ○ | X |
| (4) | — | X | ○ |

Plate extension evaluation indication

| Indication: | Plate extension |
|---|---|
| ○: | 0 mm to less than 0.04 mm |
| Δ: | 0.04 mm to less than 0.05 mm |
| X: | 0.05 mm or more |

Image loss evaluation indication

| Indication | Image loss |
|---|---|
| ○: | None |
| Δ: | Little |
| X: | Clearly shown |

As seen from the description made so far, if the sample surface roughness is center line average roughness Ra=less than 3 μm, the plate material warp (extension) suppression effect is not sufficient; on the other hand, if the surface roughness exceeds 12.0 μm, an image loss is conspicuous. Therefore, when the surface roughness is within the range of the invention, plate material warp (extension) can be well prevented while the image is kept good.

The print work values were good with every sample.

In the examples, the advantages and validity of the invention have been described using the packing sheet material with at least one face formed as a coarse face in the other embodiment. However, if the face of the plate cylinder of the printing apparatus in the one embodiment is made coarse, a similar effect can also be produced, needless to say.

Figure 10:
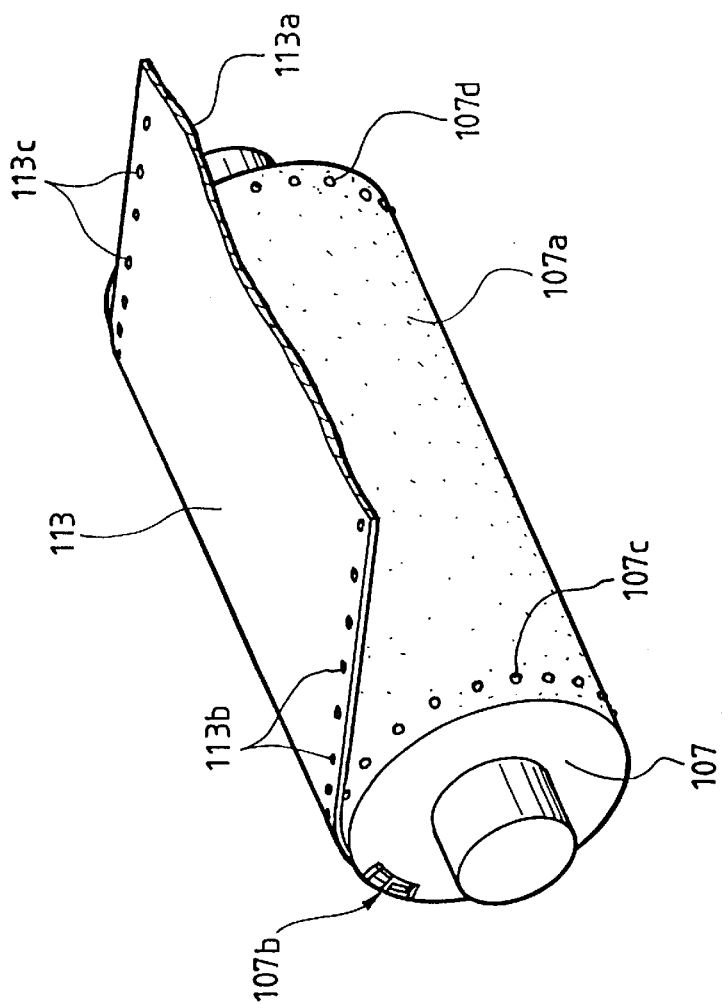
FIG. 10 shows the main part of printing apparatus of the invention and is a conceptual perspective view to show another embodiment of a plate cylinder.

In the planographic printing apparatus according to the invention, as shown in FIG. 10, if the plate cylinder 107 is formed in both side margins with protrusions 107c and 107d in the circumferential direction and the plate material 113 is formed in left and right margins with plate cylinder engagement holes 113b and 113c along the transport direction and the plate cylinder engagement holes 113b and 113c are engaged in the protrusions 107c and 107d of the plate cylinder 107 for holding the plate material 113 on the plate cylinder 107, the plate material 113 can be positioned accurately and easily. A position shift caused by extension of the parts of the plate material 113, etc., can be prevented because of the presence of the coarse face of at least either of the surface 107a of the plate cylinder 107 and the rear face 113a of the plate material 113.

Figure 23:
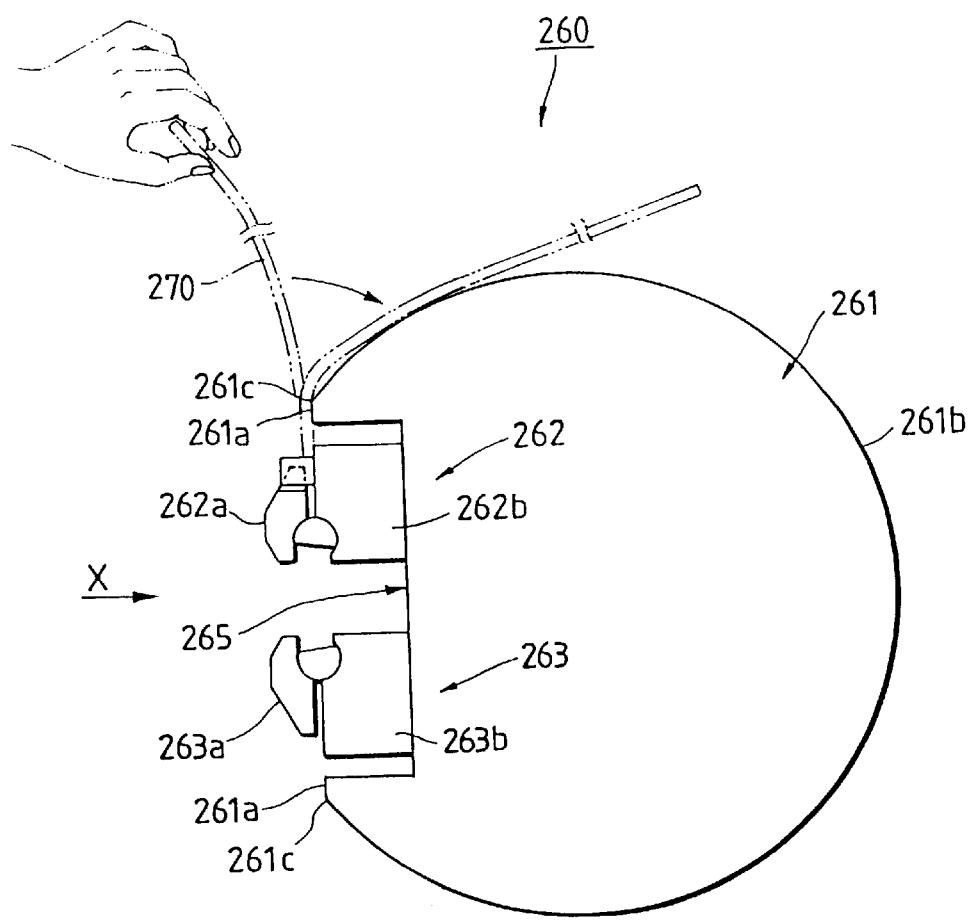
FIG. 23 is a drawing to show a plate material placement apparatus in a related art.
Figure 24:
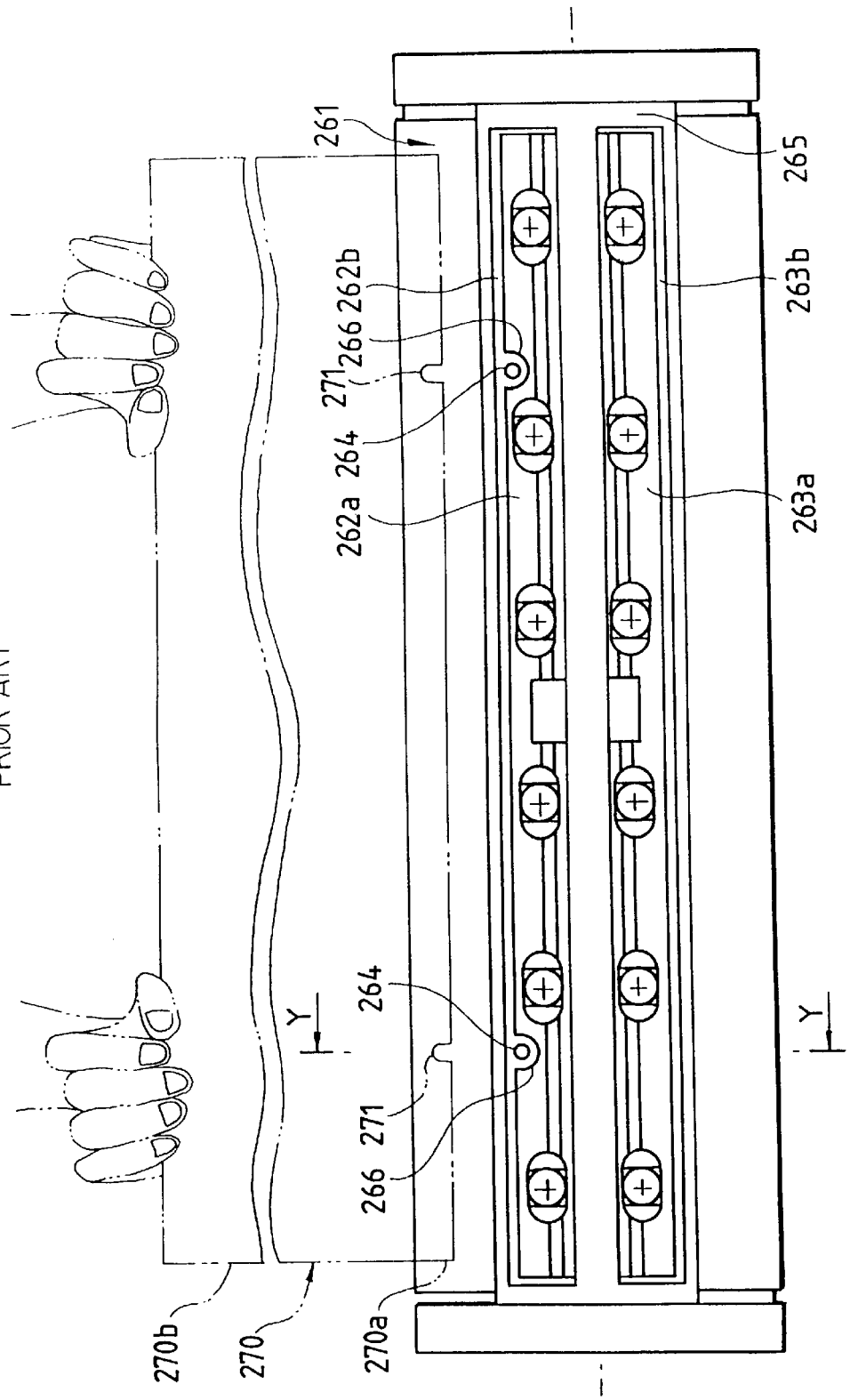
FIG. 24 is an X arrow view in FIG. 23.

Referring now to the accompanying drawings (FIGS. 11 to 22), there are shown preferred embodiments of the plate material placement method and apparatus according to the invention. Parts identical with or similar to those previously described with reference to FIGS. 23 and 24 are denoted by the same reference numerals in FIGS. 11 to 22 for simplifying or omitting the description.

Figure 11:
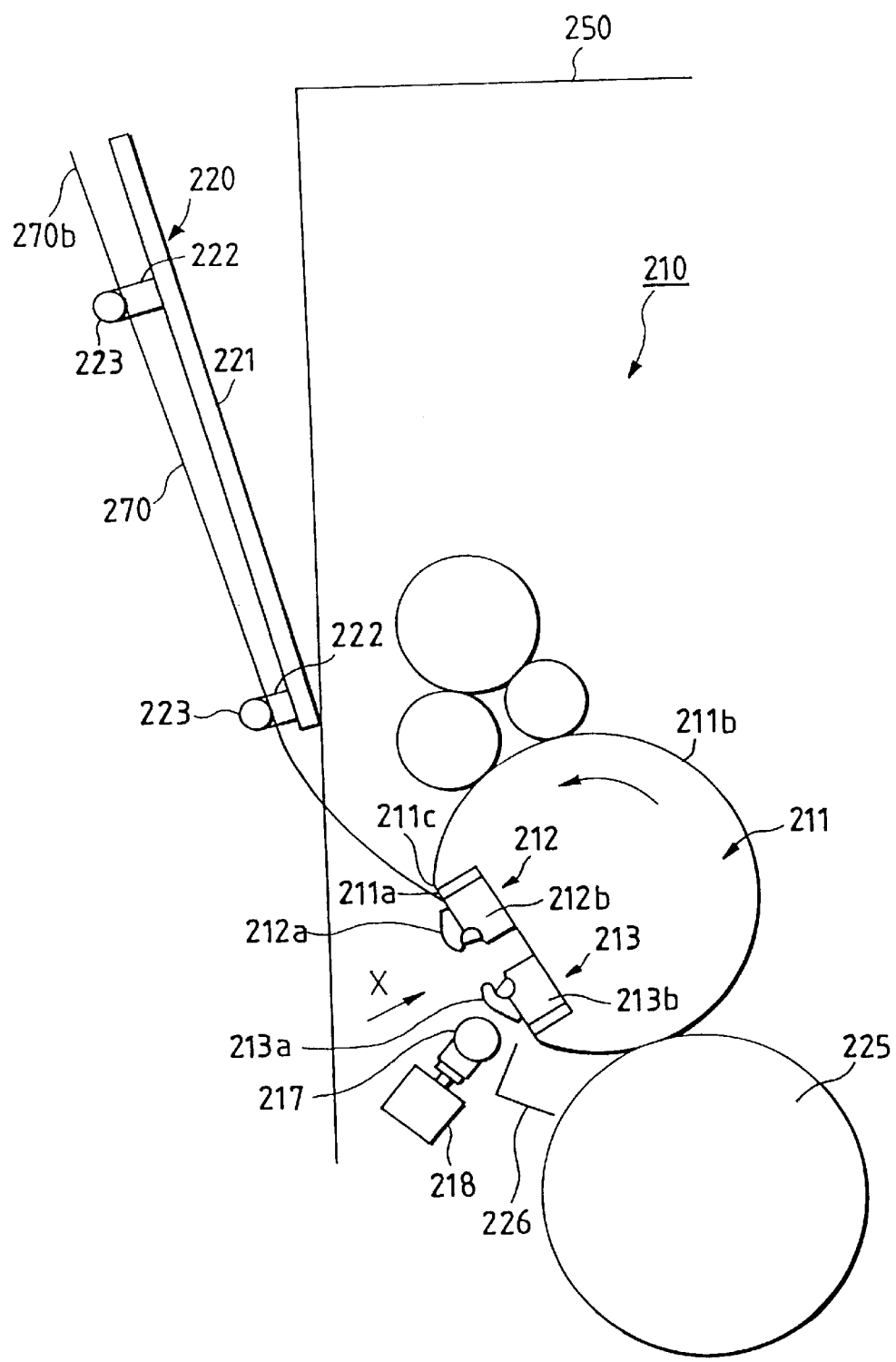
FIG. 11 is a drawing to show an one embodiment of the plate material placement method and apparatus of the invention.
Figure 12:
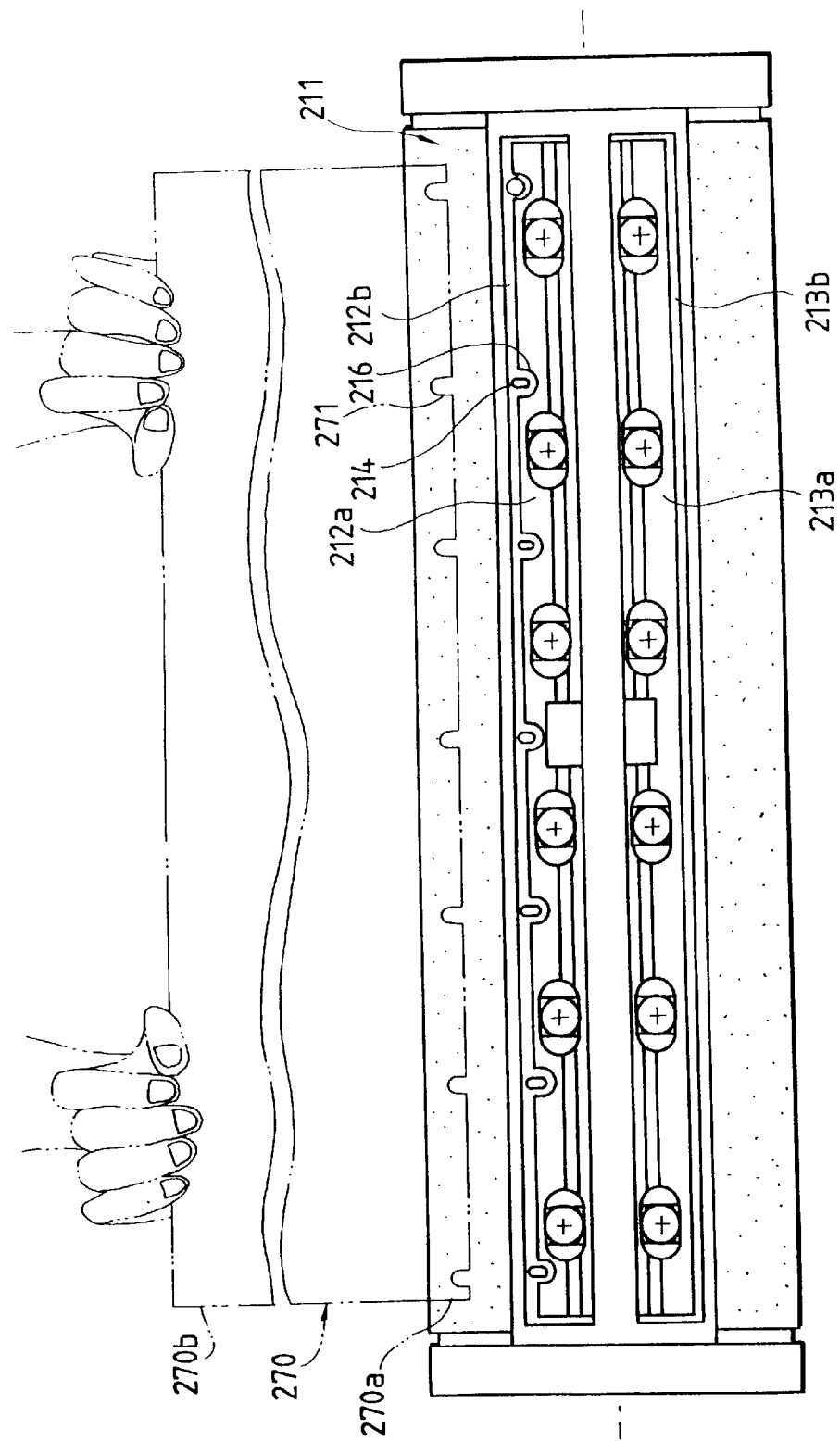
FIG. 12 is an X arrow view in FIG. 11.

FIG. 11 is a drawing to show an one embodiment of the plate material placement method and apparatus according to the invention, namely, a press plate placement apparatus 210 for placing a flexible (polyester) press plate 270 on one plate cylinder 211 in a printing apparatus 250 for multicolor printing (four-color printing). FIG. 12 is an X arrow view in FIG. 11 and shows the plate cylinder 211 in the embodiment.

As shown in FIG. 11, the press plate placement apparatus 210 comprises the plate cylinder 211 having a plate front clamp mechanism 212 and a plate back clamp mechanism 213, a press roller 217 and a rubber cylinder 225 that can be brought into contact with and placed out of contact with the outer peripheral surface of the plate cylinder 211, and guide means 220 for guiding the plate front of the press plate 270 into the plate front clamp mechanism 212. The plate cylinder 211 is rotated and stopped by control means (not shown). The control means comprises means for sensing the rotation position of the plate cylinder.

The guide means 220 comprises guide rollers 223 placed on the tops of an appropriate number of support members 222 (in this case, two) placed on a plate-like member 221. A cover for covering the side of the printing apparatus 250 is used as the plate-like member 221.

The rubber cylinder 225 can be brought into contact with and placed out of contact with the plate cylinder 211 and when the press plate 270 is placed on the plate cylinder 211, it can also be sandwiched between the rubber cylinder 225 and the plate cylinder 211. A hand cover 226 which is roughly like L in cross section is disposed on the insertion side of the press plate 270 (left in the figure) at the contact point between the plate cylinder 211 and the rubber cylinder 225 for preventing the operator from getting his or her finger caught between the rubber cylinder 225 and the plate cylinder 211 in error.

Figure 13:
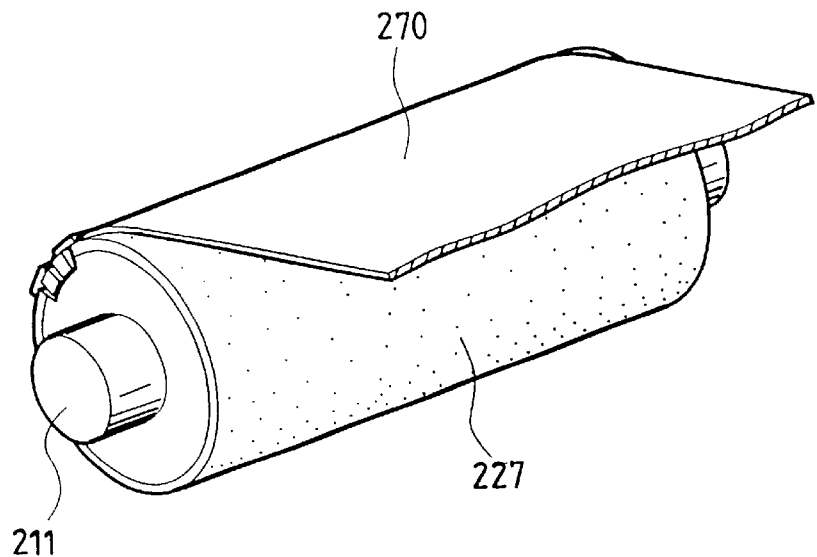
FIG. 13 is a drawing to show a packing sheet material wound around a plate cylinder in the one embodiment of the plate material placement method and apparatus of the invention.

As shown in FIG. 13, a packing sheet material 227 with at least one face formed as a coarse face is wound around and fixed to the plate cylinder 211 so that the coarse face becomes the surface side. The sheet-like base substance used for the packing sheet material 227 can adopt plastic of polyethylene terephthalate, polypropylene, polyethylene, etc., metal of aluminum, SUS, etc., paper, synthetic paper, or cloth; it may be a substance well fitted to the plate cylinder of the printing apparatus.

The surface roughness of the coarse face is set in the range of 3 μm to 12 μm as center line average roughness Ra, because if the surface roughness is less than 3 μm, a warp (extension) suppression effect of a plate material cannot be provided and if the surface roughness is larger than 12 μm, protrusions affect the plate surface, causing an image defect to occur on print matter.

Figure 14:
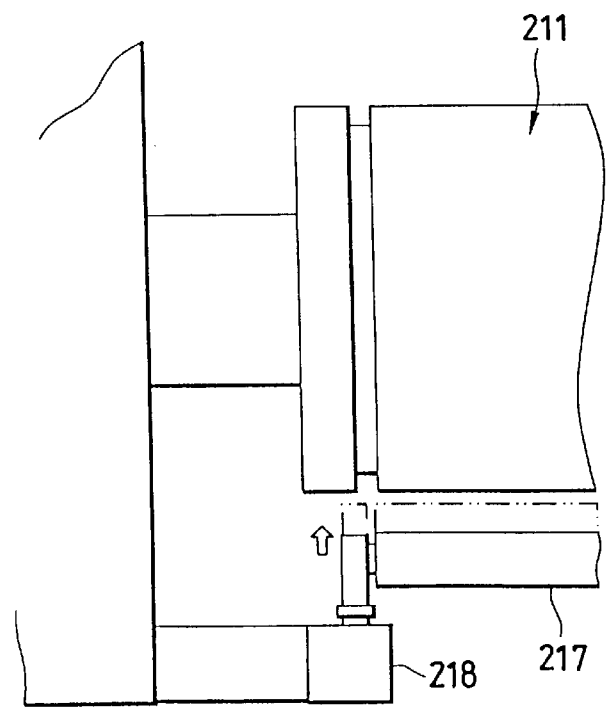
FIG. 14 is a drawing to show a press roller in the one embodiment of the plate material placement method and apparatus of the invention.

As shown in FIG. 14, the press roller 217 is fitted to proper drive means such as a cylinder 218 and can be brought into contact with and placed out of contact with the outer peripheral surface of the plate cylinder 211. Preferably, the press roller 217 is made of an elastic material such as rubber so as not to cause damage to a flexible press plate.

As shown in FIG. 12, a lower tooth 212b of the plate front clamp mechanism is formed on the top with three or more positioning pins 214 (in this case, seven) spaced from each other at predetermined intervals in an axial direction of the plate cylinder 261. Only one of the positioning pins 214 at the right in the figure is circular in cross section and each of other positioning pins is shaped like a cross-sectional form such that both sides of a circle are cut in a direction orthogonal to the axial direction of the plate cylinder so that the width of the positioning pin in the axial direction of the plate cylinder is narrower than that of the positioning pin which is circular in cross section in the axial direction of the plate cylinder.

Notches 216 are formed at appropriate positions of an upper tooth 212a corresponding to the positioning pins 214. Notches 271 are formed at appropriate positions of a plate front 270a of the press plate 270 corresponding to the positioning pins 214.

To place the press plate 270 on the plate cylinder 211, first the operator pushes the press plate 270 so as to insert the plate front 270a into the space between the upper tooth 212a and the lower tooth 212b of the plate front clamp mechanism while holding a plate back 270b of the press plate 270 and abuts the inner peripheral surfaces of the notches 271 of the plate front 270a against the positioning pins 214 shown in FIG. 12 for positioning the plate front 270a. In this state, the operator closes the upper tooth 212a and fixes the plate front 270a.

Next, in the state in FIG. 11, the plate cylinder 211 is rotated counterclockwise by the control means (not shown) for winding the press plate 270 around the plate cylinder. When the plate cylinder 211 is rotated and the control means senses the rotation position of the plate cylinder at which the press roller 217 can abut a flat face part 211a of the plate cylinder, the control means stops rotating the plate cylinder 211.

Figure 15:
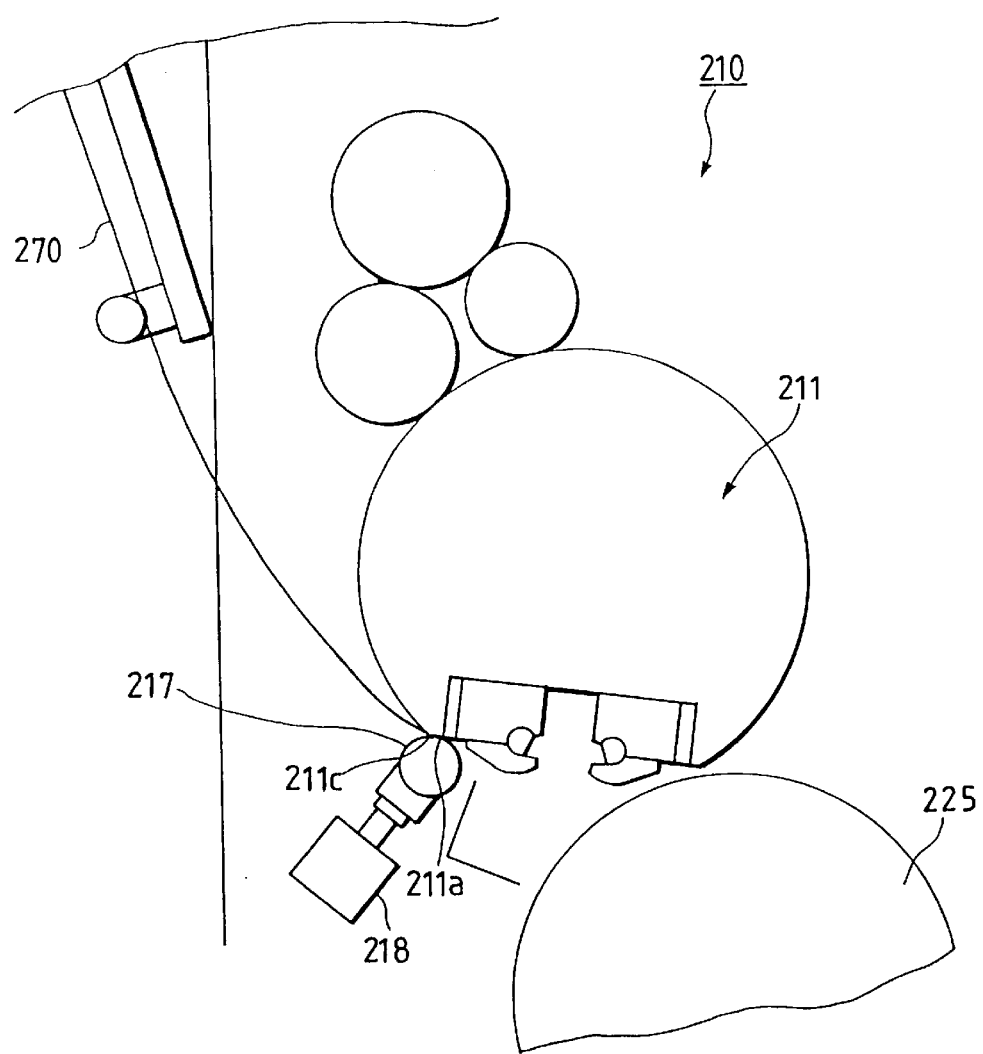
FIG. 15 is a drawing to show plate material placement according to the one embodiment.

As shown in FIG. 15, the press roller 217 is abutted against the flat face part 211a of the plate cylinder for pressing the press plate 270 against the outer peripheral surface of the plate cylinder 211. Again, the plate cylinder 211 is rotated counterclockwise by the control means (not shown). Thus, the press plate 270 can be pressed against the outer peripheral surface of the plate cylinder before and after (in other words, in adjacent to) a peak part 211c of the plate cylinder by means of the press roller 217. At this time, the press roller 217 urged toward the outer peripheral surface of the plate cylinder by the cylinder 218 moves in accordance with the shape of the outer peripheral surface of the plate cylinder.

When the plate cylinder 211 is rotated and the press plate 270 is sandwiched between the plate cylinder 211 and the rubber cylinder 225, the press roller 217 may be retreated from the press plate 270; here, the press roller 217 is set so as to continue pressing the press plate.

Figure 16:
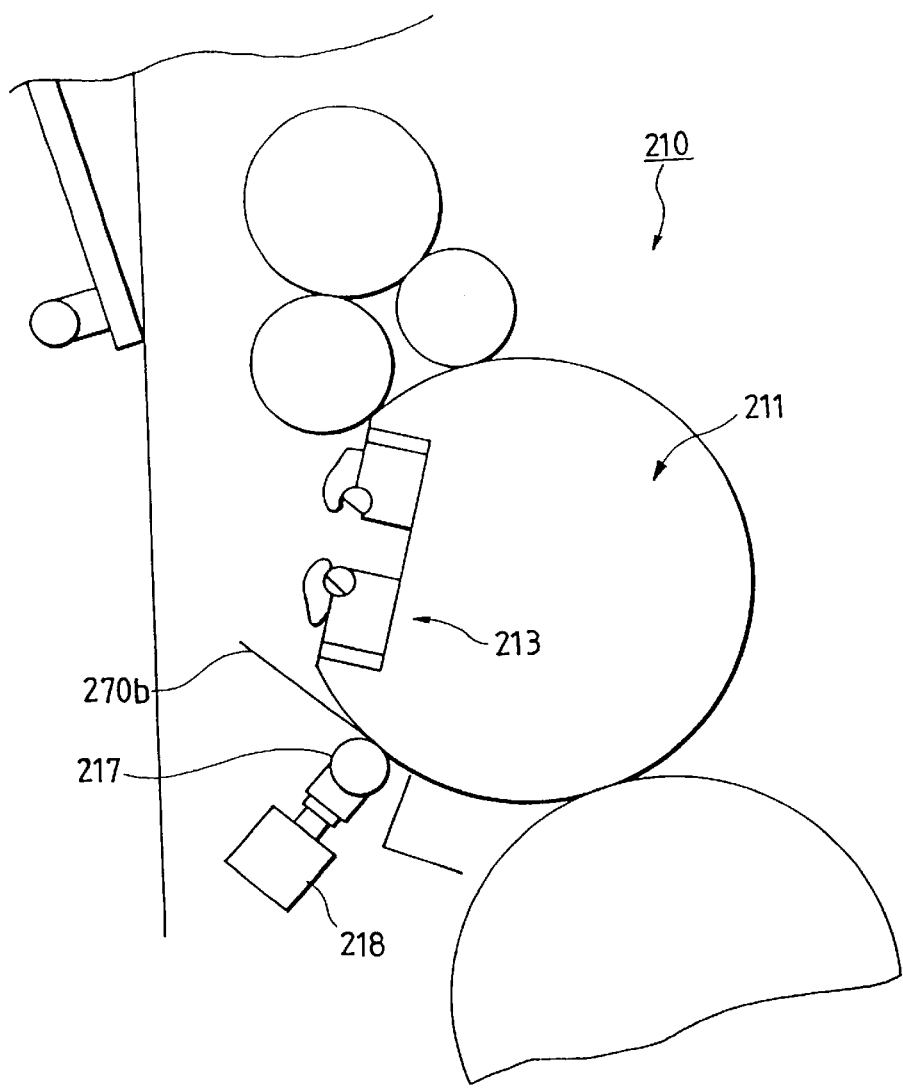
FIG. 16 is a drawing to show plate material placement according to the one embodiment.

When the press plate is wound to the neighborhood of the plate back clamp mechanism 213 as shown in FIG. 16, the control means (not shown) stops rotating the plate cylinder 211.

Figure 17:
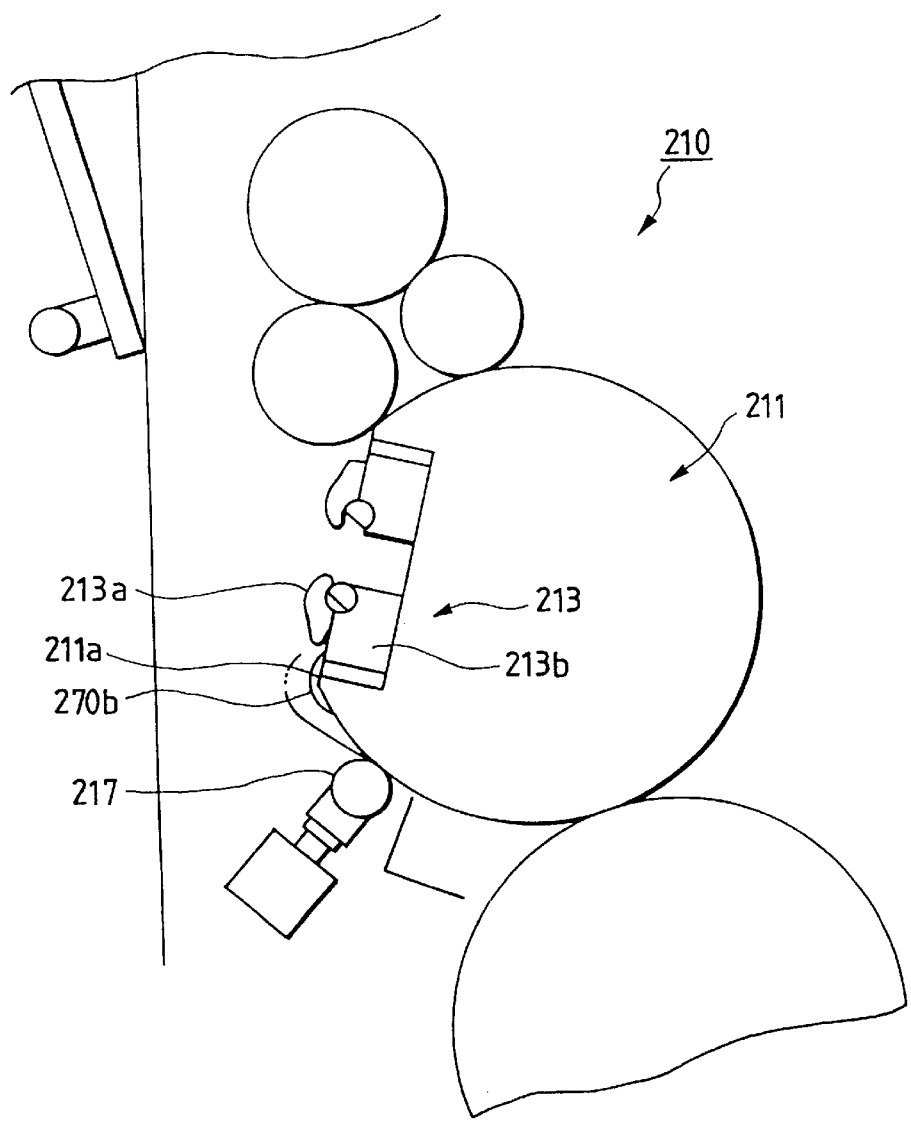
FIG. 17 is a drawing to show plate material placement according to the one embodiment.
Figure 18:
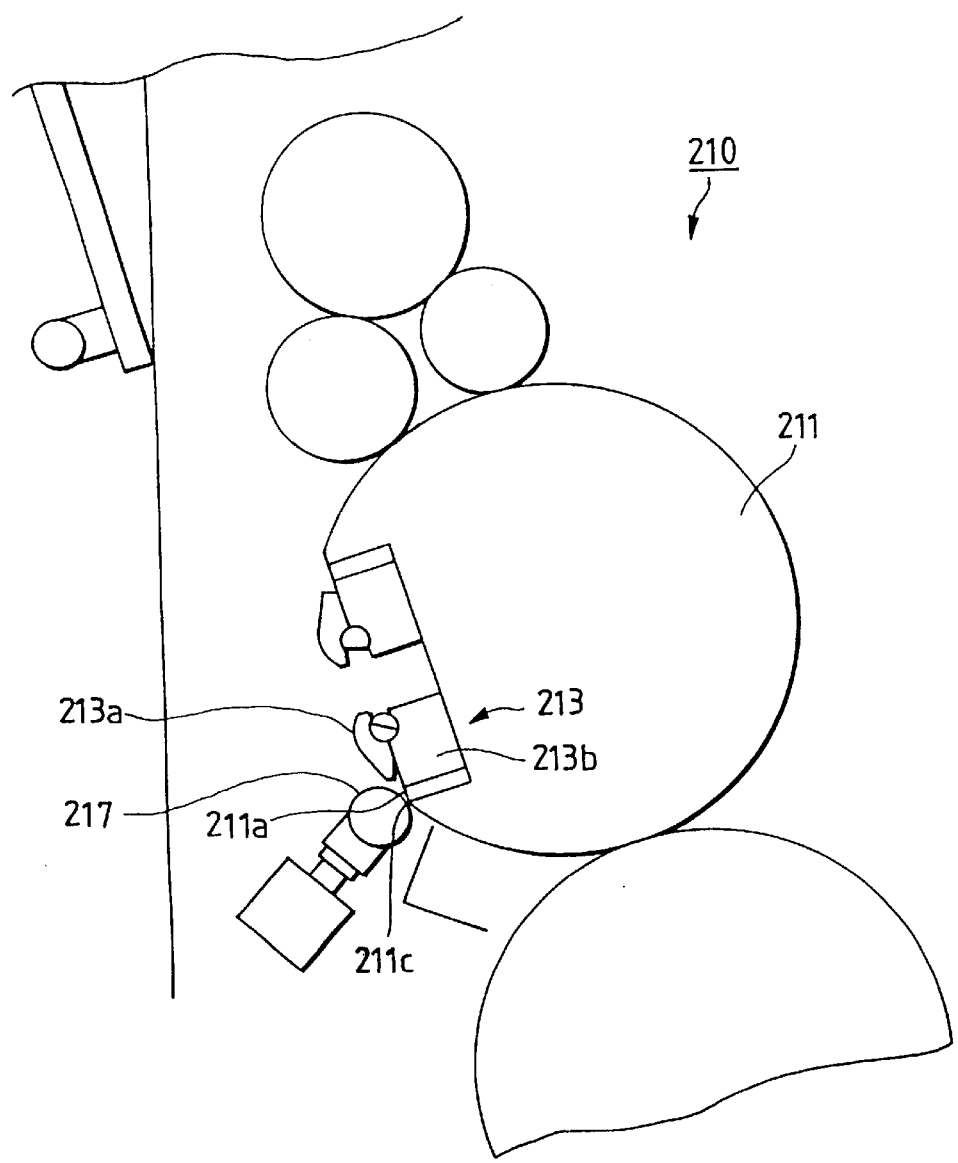
FIG. 18 is a drawing to show plate material placement according to the one embodiment.

At this point in time, the operator bends the neighborhood of the plate back 270b of the press plate and inserts the plate back 270b into the space between an upper tooth 213a and a lower tooth 213b of the plate back clamp mechanism, as shown in FIG. 17. At this time, the plate back 270b floats up from the flat face part 211a of the plate cylinder 211 and the top of the lower tooth 213b. Again, the plate cylinder 211 is rotated counterclockwise by the control means (not shown). Thus, the press plate can be pressed against the outer peripheral surface of the plate cylinder before and after (in adjacent to) the peak part of the plate cylinder by means of the press roller 217 and as shown in FIG. 18, the plate back 270b can be brought into intimate contact with the flat face part 211a and the top of the lower tooth 213b.

Last, the upper tooth 213a of the plate back clamp mechanism is closed and the plate back 270b is fixed, then the press roller 217 is retreated from the press plate 270.

Placing of the flexible print plate on the plate cylinder 211 is now complete.

In the described press plate placement apparatus 210, the plate front 270a of the flexible press plate 270 is abutted against the seven positioning pins 214 placed on the lower tooth 212b of the plate front clamp mechanism and is positioned. Therefore, the spacing between the positioning pins becomes narrow as compared with that in the related art and even a press plate of a royal octavo, etc., does not become deformed in such a manner that the plate front 270a projects from between the positioning pins 214.

In the press plate placement apparatus 210, the press roller 217 presses the press plate against the outer peripheral surface of the plate cylinder before and after the peak part 211c of the outer peripheral surface of the plate cylinder (peak part on the plate front clamp mechanism 212 side and peak part on the plate back clamp mechanism 213 side), so that the press plate 270 placed on the plate cylinder 211 does not float up from the outer peripheral surface of the plate cylinder. Therefore, the operator need not strongly pull the plate back 270b to remove floating up of the press plate 270, thus the plate back 270b of the flexible press plate 270 does not suffer deformation such as extension. A load can be taken off the operator.

In the embodiment, when the plate back 270b is fixed to the plate back clamp mechanism 213, the operators bends the neighborhood of the plate back 270b and inserts the plate back 270b into the space between the upper tooth 213a and the lower tooth 213b of the plate back clamp mechanism, so that the plate back clamp mechanism 213 need not be of a structure for enabling the upper tooth 213a to be opened largely. Therefore, there is no fear of rotating the plate cylinder in error with the upper tooth 213a of the plate back clamp mechanism opened largely for causing damage to another member or injuring the operator.

The cover of the printing apparatus 250 is used as the plate-like member of the guide means 220, whereby the apparatus can be miniaturized.

The width of one of the seven positioning pins 214 in the axial direction of the plate cylinder is set wider than that of each of other positioning pins in the axial direction of the plate cylinder. Therefore, the inner peripheral surfaces of the notches 271 of the press plate can be easily abutted against the positioning pins 214. The press plate 270 can be positioned accurately by means of the positioning pin whose width in the axial direction of the plate cylinder is set wide.

Since the control means automatically rotates the plate cylinder 211 and stops rotating the plate cylinder 211 at a predetermined position, a load can be furthermore taken off the operator.

The packing sheet material 227 with at least one face formed as a coarse face is wound around the plate cylinder 211 so that the coarse face becomes the surface side. Therefore, a shift of the press plate 270 after the press plate comes in contact with the outer peripheral surface of the plate cylinder can be prevented reliably.

Next, an other embodiment of the plate material placement method and apparatus according to the invention will be discussed with reference to FIGS. 19 and 20. A press plate placement apparatus of the embodiment uses the plate cylinder 261 in the related art shown in FIGS. 23 and 24 as a plate cylinder. The packing sheet material 227 with at least one face formed as a coarse face (see FIG. 13) used in the one embodiment is wound around the plate cylinder 261 so that the coarse face becomes the surface side.

The press plate placement apparatus of the other embodiment has a similar configuration to that of the press plate placement apparatus 210 of the one embodiment (see FIG. 11) except for the plate cylinder.

Figure 19:
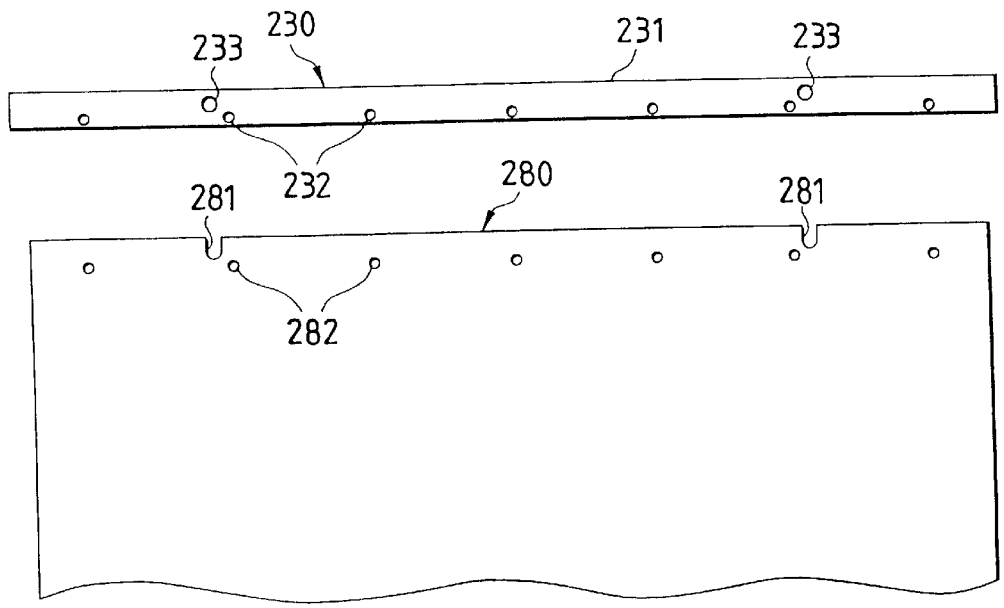
FIG. 19 is a drawing to show a plate material and a pin abutment member in the other embodiment of the plate material placement method and apparatus of the invention.

FIG. 19 shows a flexible press plate 280 and pain abutment member 230 fixedly secured to a plate front of the press plate 280, used in the other embodiment. The press plate 280 is formed at the plate front with notches 281 each shaped like U in the peripheral margin at the positions corresponding to the two positioning pins 264 shown in FIG. 24. It is also formed at the plate front with a number of fixation holes 282 (in this case, seven) spaced appropriately from each other from side to side of the press plate 280 in FIG. 19.

The pin abutment member 230 comprises a base plate 231 made of a highly rigid material of metal, etc., like a belt longer than the width of the press plate 280. Circular insertion holes 233 are made in the base plate 231 at the positions corresponding to the two positioning pins 264 shown in FIG. 24. A number of fixation pins 232 (in this case, seven) spaced appropriately from each other in the length direction of the base plate 231 are also placed on the base plate 231.

Figure 20A:
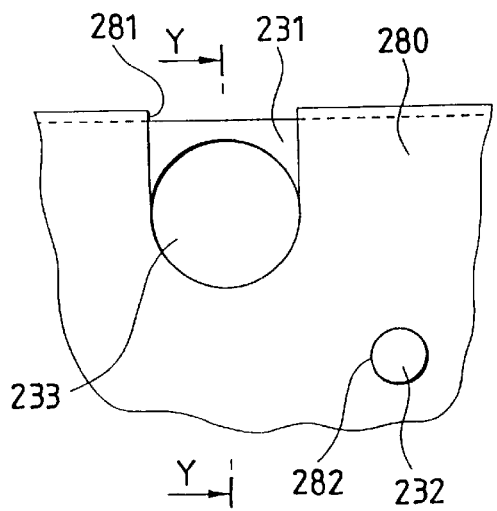
FIGS. 20A and 20B are drawings to show a state in which the pin abutment member in FIG. 19 is fixedly secured to the plate material.
Figure 20B:
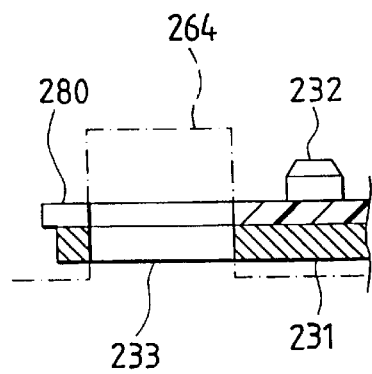

FIG. 20A is an enlarged view of the neighborhood of the notch 281 of the press plate when the pin abutment member 230 shown in FIG. 19 is fixedly secured to the plate front of the press plate 280. FIG. 20B is a sectional view taken on line Y—Y in FIG. 20A. As shown in FIG. 20A, the fixation pins 232 of the pin abutment member 230 are inserted into the fixation holes 282 of the press plate 280, whereby the pin abutment member 230 is fixedly secured to the press plate 280. At this time, a part of the peripheral margin of each circular insertion hole 233 of the pin abutment member 230 matches the bend part of the U-shaped peripheral margin of the corresponding notch 281 of the press plate 280.

When the press plate 280 is placed on the plate cylinder 261 shown in FIG. 24, the pin abutment member 230 may be fixedly secured to the plate front before the plate front is fixed to a plate front clamp mechanism, or the plate front of the press plate 280 may be fixedly secured to the pin abutment member 230 in a state in which the positioning pins 264 of the plate front clamp mechanism are inserted into the insertion holes 233 of the pin abutment member 230.

As shown in FIG. 20B, the inner peripheral surface of the notch 281 of the press plate abuts the positioning pin 264 together with the inner peripheral surface of the insertion hole 233 of the pin abutment member in the state in which the positioning pins 264 are inserted into the insertion holes 233 of the pin abutment member 230.

The press plate 280 is wound around the plate cylinder 261 and the plate back is fixed to a plate back clamp mechanism in a similar manner to that in the one embodiment.

In the described press plate placement apparatus, when the plate front of the flexible press plate 280 is positioned and fixed to the clamp mechanism, it is protected by the highly rigid pin abutment member 230 for preventing the plate front from becoming deformed. Therefore, the pin abutment member 230 can be used to prevent press plates from becoming deformed without increasing the number of the positioning pins and also makes it possible to use the plate cylinder 261 of the printing apparatus already installed. If the embodiment is applied to already installed facilities, the costs of the facilities can be reduced drastically.

Next, a further other embodiment of the plate material placement method and apparatus according to the invention will be discussed with reference to FIGS. 21 and 22. The further other embodiment has the same configuration as the other embodiment except that the pin abutment member 230 in the other embodiment is modified.

Figure 21:
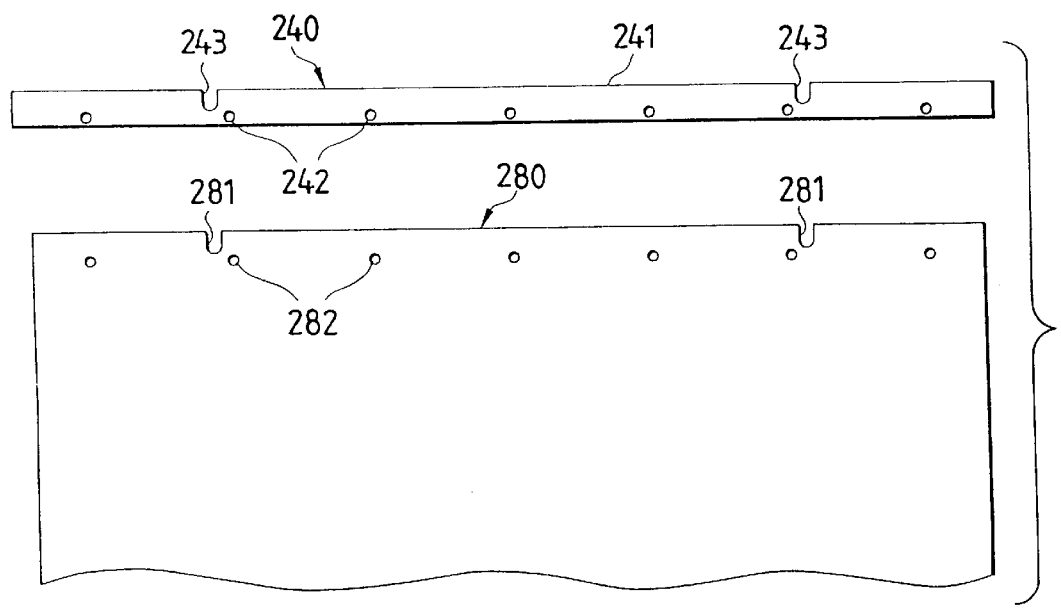
FIG. 21 is a drawing to show a plate material and a pin abutment member in a further other embodiment of the plate material placement method and apparatus of the invention.

FIG. 21 shows a flexible press plate 280 and a pin abutment member 240 fixedly secured to a plate front of the press plate 280, used in the further other embodiment.

The pin abutment member 240 comprises a base plate 241 which is made of a highly rigid material of metal, etc., and is longer than the width of the press plate 280. The base plate 241 is formed with notches 243 each shaped roughly like U in the peripheral margin at the positions corresponding to the two positioning pins 264 shown in FIG. 24. A number of fixation pins 242 (in this case, seven) spaced appropriately from each other in the length direction of the base plate 241 are also placed on the base plate.

Figure 22:
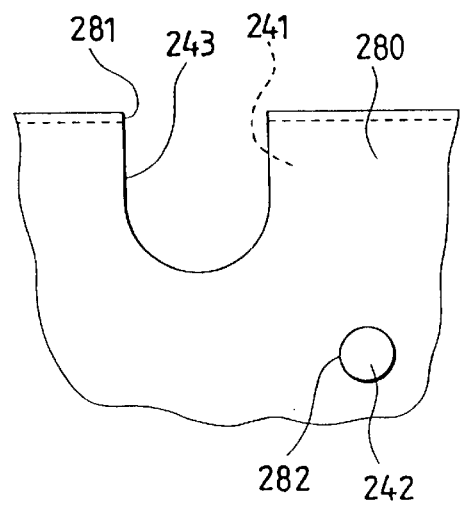
FIG. 22 is a drawing to show a state in which the pin abutment member in FIG. 21 is fixedly secured to the plate material.

FIG. 22 is an enlarged view of the neighborhood of a notch 281 of the press plate when the pin abutment member 240 is fixedly secured to the plate front of the press plate 280. As the shown here, fixation pins 242 of the pin abutment member 240 are inserted into fixation holes 282 of the press plate 280, whereby the pin abutment member 240 is fixedly secured to the press plate 280. At this time, the peripheral margin of each notch 243 of the pin abutment member 240 matches the peripheral margin of the corresponding notch 281 of the press plate 280.

According to the described press plate placement apparatus, when the pin abutment member 240 is fixedly secured to the plate front of the press plate 280 and then the plate front is fixed to the plate front clamp mechanism, the pin abutment member 240 can be inserted between an upper tooth and a lower tooth of the plate front clamp mechanism, so that positioning and fixing of the plate front are furthermore simplified.

The invention is not limited to the above-described embodiments and the embodiments can be modified, changed, etc., appropriately.

For example, in the embodiments, the packing sheet material 227 with at least one face formed as a coarse face (see FIG. 13) is wound around the plate cylinder so that the coarse face becomes the surface side, but a packing sheet material with at least one face formed as an adhesive face may be wound around and fixed to the plate cylinder so that the adhesive face becomes the surface side.

The adhesive face can be formed by spraying a spray bonding agent on, putting double-sided tape on, or applying an adhesive material to a sheet-like base substance like the sheet-like base substance used for the packing sheet material 227, for example.

Note that although the above-mentioned embodiments according to the present invention were separately explained, it is possible to apply one to another (that is to combine two or more embodiments) so as to further improve an efficiency, a printing quality or the like The present invention is based on three Japanese Patent Application Nos. Hei. 10-273745, Hei. 10-124865 and Hei. 10-101330, which are incorporated herein by reference.

While there has been described in connection with the preferred embodiment of the invention, it will be obvious to those skilled in the art that various changes and modifications may be made therein without departing from the invention, and it is aimed, therefore, to cover in the appended claim all such changes and modifications as fall within the true spirit and scope of the invention.

As described above, the plate making apparatus of the invention comprises the cutter being placed between the storage section of a roll-like plate material and the exposure section for cutting the roll-like plate material like a sheet, the punch means for punching the plate cylinder engagement holes, and the punch means for punching the exposure reference holes. Therefore, with the plate making apparatus of the invention, the plate material fed out from the storage section is cut by the cutter in the transport process from the storage section to the exposure section and moreover the exposure reference holes and the plate cylinder engagement holes used for positioning the plate material when the plate material is placed on the plate cylinder are made at a time efficiently. Moreover, since their positional relationship is kept with high accuracy, a plate material with little position shift of an image can be provided.

As described above, according to the invention, the surface roughness of at least either of the surface of the plate cylinder and the rear face of the plate material is a coarse face with center line average roughness Ra ranging from 3 µm to 12 µm, thus the friction coefficient between the plate cylinder and the plate material increases, the plate material is securely held on the plate cylinder, and moreover an image defect does not occur on print matter. Therefore, planographic printing is enabled with a flexible printing member and a color shift caused by a plate material shift does not occur; the invention is useful for multicolor planographic printing.

As described above in detail, according to the plate material placement method and the plate material placement apparatus of the invention, a flexible plate material can be placed on the plate cylinder reliably and easily and can be applied to multicolor printing, etc., with no registration.

What is claimed is:

1. A plate material placement method for placing a flexible plate material on a plate cylinder which is provided with a plate front clamp mechanism and a plate back clamp mechanism each having an upper tooth portion and a lower tooth portion, said method comprising the steps of:

inserting a plate front of the plate material into a space between the upper tooth portion and the lower tooth portion of the plate front clamp mechanism;

providing at least three positioning pins projected from the lower tooth portion;

winding an intermediate portion of the plate material between said front plate and a back of the plate material onto said plate cylinder while said plate cylinder is rotated;

inserting said plate back into a space between the upper tooth portion and the lower tooth portion of the plate back clamp mechanism while a portion adjacent to the plate back is bent;

rotating said plate cylinder so as to make a peak:part of an outer peripheral surface of the plate cylinder pass by a press roller, while pressing the plate material against the outer peripheral surface of the plate cylinder by the press roller; and fixing the plate back between the upper tooth portion and the lower tooth portion the back clamp mechanism.

2. The plate material placement method according to claim 1, in which said winding step is conducted while the plate material is pressed against the outer peripheral surface of the plate cylinder by said press roller.

3. A plate material placement method for placing a flexible plate material on a plate cylinder which is provided with a plate front clamp mechanism and a plate back clamp mechanism each having an upper tooth portion and a lower tooth portion, the method comprising the steps of:

attaching a pin abutment member having higher rigidity than said plate material to two positioning pins projected from the lower tooth tooth portion;

inserting a plate front of the plate material into a space between the upper tooth portion and the lower tooth portion of the plate front clamp mechanism, as well as securing the plate front of the plate material to the pin abutment member in such a manner that a plurality of fixation pins placed on the pin abutment member are respectively inserted into a plurality of fixation holes formed in the plate material;

winding an intermediate portion of the plate material between the front plate and a plate plate of the back material onto the plate cylinder while the plate cylinder is rotated;

inserting the plate back into a space between the upper tooth portion and the lower tooth portion of the plate back clamp mechanism while a portion adjacent to the plate back is bent;

rotating the plate cylinder so as to make a peak part of an outer peripheral surface of the plate cylinder pass by a press roller, while pressing the plate material against an outer peripheral surface of a plate cylinder by the press roller; and fixing the plate back between the upper tooth portion and the lower tooth portion at the back clamp mechanism.

4. A plate material placement method for placing a flexible plate material on a plate cylinder which is provided with a plate front clamp mechanism and a plate back clamp mechanism each having an upper tooth portion and a lower tooth portion, the method further comprising the steps of:

attaching a pin abutment member having higher rigidity than the plate material to the plate front of the plate material in such a manner that a plurality of fixation pins placed on the pin abutment member are inserted into a plurality of fixation holes formed in the plate material;

inserting the plate front of the plate material into a space between the upper tooth portion and the lower tooth portion of the plate front clamp mechanism;

positioning and fixing the plate front to the clamp mechanism in such a matter that the pin abutment member is abutted against two positioning pins projected from the lower tooth portion;

winding an intermediate portion of the plate material between the front plate and a plate back of the plate material onto the plate cylinder while the plate cylinder is rotated;

inserting the plate back into a space between the upper tooth portion and the lower tooth portion of the plate back clamp mechanism while a portion adjacent to the plate back is bent;

rotating the plate cylinder so as to make a peak part of an outer peripheral surface of the plate cylinder pass by a press roller, while pressing the plate material against an outer peripheral surface of a plate cylinder by the press roller; and fixing the plate back between the upper tooth portion and the lower tooth portion at the back clamp mechanism.

5. A plate material placement apparatus comprising:

a plate cylinder on which a flexible plate material is placed;

a plate front clamp mechanism and a plate back clamp mechanism each having an upper tooth and a lower tooth, said clamp mechanisms being formed on said plate cylinder;

a press roller for pressing the plate material against an outer peripheral surface of the plate cylinder; and at least three positioning pins against which a plate front of the plate material is abutted for positioning the plate front, in which said at least three positioning pins are placed on the lower tooth of the plate front clamp mechanism in a predetermined interval in an axial direction of the plate cylinder.

6. The plate material placement apparatus according to claim 5, further comprising:

guide mechanism for guiding the plate front of the plate material into the plate front clamp mechanism.

7. The plate material placement apparatus according to claim 5, wherein at least one of said positioning pins is wider than that of each of other positioning pins in the axial direction of the plate cylinder.

8. The plate material placement apparatus according to claim 5, further comprising:

means for rotating the plate cylinder;

means for detecting a rotation position of the plate cylinder; and means for stopping a rotation of the plate cylinder at a predetermined position when the plate material is placed.

9. The plate material placement apparatus according to claim 5, in which said plate cylinder is provided with a packing sheet material which is wound around said plate cylinder, and said packing sheet material includes a sheet-like base substance with at least one coarse face which is exposed to the outside thereof.

10. The plate material placement apparatus according to claim 5, in which said plate cylinder is provided with a packing sheet material which is wound around said plate cylinder, and said packing sheet material includes a sheet-like base substance with an adhesive face which is exposed the outside thereof.

11. A plate material placement apparatus comprising:

a plate cylinder on which a flexible plate material is placed;

a plate front clamp mechanism and a plate back clamp mechanism each having an upper tooth and a lower tooth, said clamp mechanisms being formed on said plate cylinder;

a press roller for pressing the plate material against an outer peripheral surface of the plate cylinder;

a pin abutment member having higher rigidity than the plate material, to which a plate front of the plate material is fixedly secured, for abutting at least three positioning pins placed on the lower tooth of the plate front clamp mechanism, thereby positioning the plate material; and a plurality of pins and holes for positioning and fixing the pin abutment member and the plate material.

12. The plate material placement apparatus according to claim 11, further comprising:

guide mechanism for guiding the plate front of the plate material into the plate front clamp mechanism.

13. The plate material placement apparatus according to claim 11, further comprising:

means for rotating the plate cylinder;

means for detecting a rotation position of the plate cylinder; and means for stopping a rotation of the plate cylinder at a predetermined position when the plate material is placed.

14. The plate material placement apparatus according to claim 11, in which said plate cylinder is provided with a packing sheet material which is wound around said plate cylinder, and said packing sheet material includes a sheet-like base substance with at least one coarse face which is exposed to the outside thereof.

15. The plate material placement apparatus according to claim 11, in which said plate cylinder is provided with a packing sheet material which is wound around said plate cylinder, and said packing sheet material includes a sheet-like base substance with an adhesive face which is exposed the outside thereof.

\* \* \* \* \*